(12) United States Patent
Wang et al.

(10) Patent No.: US 12,446,255 B2
(45) Date of Patent: Oct. 14, 2025

(54) SEMICONDUCTOR STRUCTURE WITH SOURCE/DRAIN MULTI-LAYER STRUCTURE AND METHOD FOR FORMING THE SAME

(71) Applicant: Parabellum Strategic Opportunities Fund LLC, Wilmington, DE (US)

(72) Inventors: Chun-Chieh Wang, Kaohsiung (TW); Yu-Ting Lin, Tainan (TW); Yueh-Ching Pai, Taichung (TW); Shih-Chieh Chang, Taipei (TW); Huai-Tei Yang, Hsin-Chu (TW)

(73) Assignee: Parabellum Strategic Oppurtunities Fund LLC, Austin, TX (US)

( * ) Notice: Subject to any disclaimer, the term of this patent is extended or adjusted under 35 U.S.C. 154(b) by 0 days.

(21) Appl. No.: 18/637,874

(22) Filed: Apr. 17, 2024

(65) Prior Publication Data

US 2024/0266439 A1    Aug. 8, 2024

Related U.S. Application Data

(63) Continuation of application No. 18/063,711, filed on Dec. 9, 2022, now Pat. No. 11,990,550, which is a (Continued)

(51) Int. Cl.
*H10D 30/62* (2025.01)
*H01L 21/02* (2006.01)
(Continued)

(52) U.S. Cl.
CPC ..... *H10D 30/6217* (2025.01); *H01L 21/0217* (2013.01); *H01L 21/0228* (2013.01);
(Continued)

(58) Field of Classification Search
CPC ............ H01L 29/7856; H01L 29/0649; H01L 29/0847; H01L 29/66545; H01L 29/66553;
(Continued)

(56) References Cited

U.S. PATENT DOCUMENTS 5,903,027 A    5/1999 Yoshitomi
6,861,318 B2    3/2005 Murthy et al.
(Continued)

FOREIGN PATENT DOCUMENTS

CN    104350603 A    2/2015

OTHER PUBLICATIONS

Rodder et. al. "Raised Source/Drain MOSFET . . . ",IEEE Electron Device Letters, vol. 12, No. 3, Mar. 1991 (Year: 1991).

*Primary Examiner* — Sitaramarao S Yechuri
(74) *Attorney, Agent, or Firm* — Almanac IP Advisors LLP

(57) ABSTRACT

A semiconductor structure and a method for forming the same are provided. The semiconductor structure includes a gate structure formed over a fin structure, and a gate spacer layer formed on a sidewall surface of the gate structure. The semiconductor structure includes a source/drain (S/D) epitaxial layer formed adjacent to the gate structure, and a dielectric spacer layer formed on the S/D epitaxial layer. The semiconductor structure includes a contact plug barrier formed over the S/D epitaxial layer, and a contact plug surrounding by the contact plug barrier, wherein the contact plug is separated from the gate spacer layer by the dielectric spacer layer and the contact plug barrier.

16 Claims, 17 Drawing Sheets

Related U.S. Application Data continuation of application No. 17/155,467, filed on Jan. 22, 2021, now Pat. No. 11,527,655, which is a continuation of application No. 16/654,175, filed on Oct. 16, 2019, now Pat. No. 10,937,910, which is a continuation of application No. 16/043,371, filed on Jul. 24, 2018, now Pat. No. 10,468,530.

(60) Provisional application No. 62/586,272, filed on Nov. 15, 2017.

(51) Int. Cl.
*H01L 21/3065* (2006.01)
*H01L 21/3105* (2006.01)
*H01L 21/311* (2006.01)
*H01L 21/32* (2006.01)
*H01L 21/768* (2006.01)
*H10D 30/01* (2025.01)
*H10D 62/10* (2025.01)
*H10D 62/13* (2025.01)
*H10D 64/01* (2025.01)
*H10D 84/01* (2025.01)
*H10D 84/03* (2025.01)
*H10D 84/83* (2025.01)

(52) U.S. Cl.
CPC ...... *H01L 21/3065* (2013.01); *H01L 21/3105* (2013.01); *H01L 21/31116* (2013.01); *H01L 21/32* (2013.01); *H01L 21/76897* (2013.01); *H10D 30/024* (2025.01); *H10D 30/0241* (2025.01); *H10D 62/115* (2025.01); *H10D 62/151* (2025.01); *H10D 64/018* (2025.01); *H10D 84/0158* (2025.01); *H10D 84/0193* (2025.01); *H10D 84/038* (2025.01); *H10D 84/834* (2025.01); *H10D 64/017* (2025.01); *H10D 84/017* (2025.01)

(58) Field of Classification Search
CPC .......... H01L 29/66795; H01L 21/3065; H01L 21/76897; H01L 21/823814; H01L 21/823821; H01L 27/0886; H01L 21/0217; H01L 21/0228; H01L 21/3105; H01L 21/31116; H01L 21/32; H01L 21/28518; H10D 30/6217; H10D 30/024; H10D 30/0241; H10D 62/115; H10D 62/151; H10D 64/018; H10D 64/017; H10D 84/0158; H10D 84/0193; H10D 84/038; H10D 84/834; H10D 84/017
See application file for complete search history.

(56) References Cited

U.S. PATENT DOCUMENTS

| | | | |
|---|---|---|---|
| 7,524,716 B2 | 4/2009 | Ting et al. | |
| 7,968,912 B2 | 6/2011 | Kim et al. | |
| 8,022,488 B2 | 9/2011 | Cheng et al. | |
| 8,035,141 B2 | 10/2011 | Chan et al. | |
| 8,679,910 B2 | 3/2014 | Ming | |
| 8,772,109 B2 | 7/2014 | Colinge | |
| 8,785,285 B2 | 7/2014 | Tsai | |
| 8,816,444 B2 | 8/2014 | Wann | |
| 8,823,065 B2 | 9/2014 | Wang | |
| 8,860,148 B2 | 10/2014 | Hu | |
| 8,866,230 B2 | 10/2014 | Tung | |
| 8,946,791 B2 | 2/2015 | Basker et al. | |
| 9,105,490 B2 | 8/2015 | Wang | |
| 9,214,551 B2 | 12/2015 | Chang et al. | |
| 9,236,267 B2 | 1/2016 | De | |
| 9,236,300 B2 | 1/2016 | Liaw | |
| 9,269,811 B2 | 2/2016 | Chou | |
| 9,287,399 B2 | 3/2016 | Chandra et al. | |
| 9,484,432 B2 | 11/2016 | Glass et al. | |
| 9,520,482 B1 | 12/2016 | Chang | |
| 9,576,814 B2 | 2/2017 | Wu | |
| 9,966,453 B2 | 5/2018 | Reboh et al. | |
| 10,468,530 B2 * | 11/2019 | Wang | H10D 30/6217 |
| 2005/0208756 A1 * | 9/2005 | Matsushita | H01L 21/31138 438/626 |
| 2006/0144435 A1 | 7/2006 | Wanlass | |
| 2006/0234488 A1 | 10/2006 | Kim et al. | |
| 2008/0006818 A1 | 1/2008 | Luo et al. | |
| 2010/0244150 A1 | 9/2010 | Bahl | |
| 2011/0042744 A1 | 2/2011 | Cheng | |
| 2011/0223736 A1 | 9/2011 | Lin | |
| 2012/0015490 A1 | 1/2012 | Lee | |
| 2012/0088342 A1 | 4/2012 | Ming | |
| 2012/0126331 A1 | 5/2012 | Lin | |
| 2013/0193526 A1 | 8/2013 | Lo | |
| 2013/0264643 A1 | 10/2013 | Lee | |
| 2014/0291606 A1 * | 10/2014 | Avouris | H10D 62/119 438/466 |
| 2014/0335674 A1 | 11/2014 | Liao | |
| 2015/0061010 A1 | 3/2015 | Cheng et al. | |
| 2015/0091086 A1 | 4/2015 | Lu | |
| 2015/0118836 A1 * | 4/2015 | Lin | H10D 30/6219 438/586 |
| 2015/0137196 A1 * | 5/2015 | Chiang | H10D 64/251 257/288 |
| 2015/0140743 A1 | 5/2015 | Cheng | |
| 2015/0179795 A1 | 6/2015 | Kim | |
| 2015/0221768 A1 | 8/2015 | Zhong | |
| 2015/0332963 A1 | 11/2015 | Wu | |
| 2015/0364604 A1 | 12/2015 | Su | |
| 2015/0380305 A1 | 12/2015 | Basker | |
| 2016/0027918 A1 | 1/2016 | Kim | |
| 2016/0043190 A1 | 2/2016 | Banghart | |
| 2016/0087053 A1 | 3/2016 | Kim | |
| 2016/0133748 A1 | 5/2016 | Kang | |
| 2016/0155818 A1 | 6/2016 | Cheng | |
| 2016/0254351 A1 * | 9/2016 | Tsai | H10D 62/60 257/77 |
| 2016/0284837 A1 | 9/2016 | Kim | |
| 2016/0307927 A1 | 10/2016 | Lee | |
| 2016/0351570 A1 | 12/2016 | Park et al. | |
| 2017/0047243 A1 * | 2/2017 | Shin | H10D 84/834 |
| 2017/0077031 A1 * | 3/2017 | Lu | H01L 21/28525 |
| 2017/0092768 A1 | 3/2017 | Sung | |
| 2017/0170315 A1 | 6/2017 | Ok | |
| 2018/0197993 A1 | 7/2018 | Luo | |
| 2018/0286861 A1 * | 10/2018 | Choi | H10D 30/62 |
| 2019/0051565 A1 | 2/2019 | Baars et al. | |

\* cited by examiner

SEMICONDUCTOR STRUCTURE WITH SOURCE/DRAIN MULTI-LAYER STRUCTURE AND METHOD FOR FORMING THE SAME

CROSS REFERENCE TO RELATED APPLICATIONS

This application is a Continuation application of U.S. patent application Ser. No. 18/063,711, filed on Dec. 9, 2022, which is a Continuation application of U.S. patent application Ser. No. 17/155,467, filed on Jan. 22, 2021, which is a Continuation application of U.S. patent application Ser. No. 16/654,175, filed on Oct. 16, 2019, which is a Continuation application of U.S. patent application Ser. No. 16/043,371, filed on Jul. 24, 2018, which claims the benefit of U.S. Provisional Application No. 62/586,272, filed Nov. 15, 2017, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Despite groundbreaking advances in materials and fabrication, scaling planar devices such as the metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Advantages of the FinFET may include a reduction of the short channel effect, reduced leakage, and higher current flow.

However, since feature sizes continue to decrease, fabrication processes continue to become more difficult to perform. Therefore, it is a challenge to form a reliable semiconductor structure including the FinFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
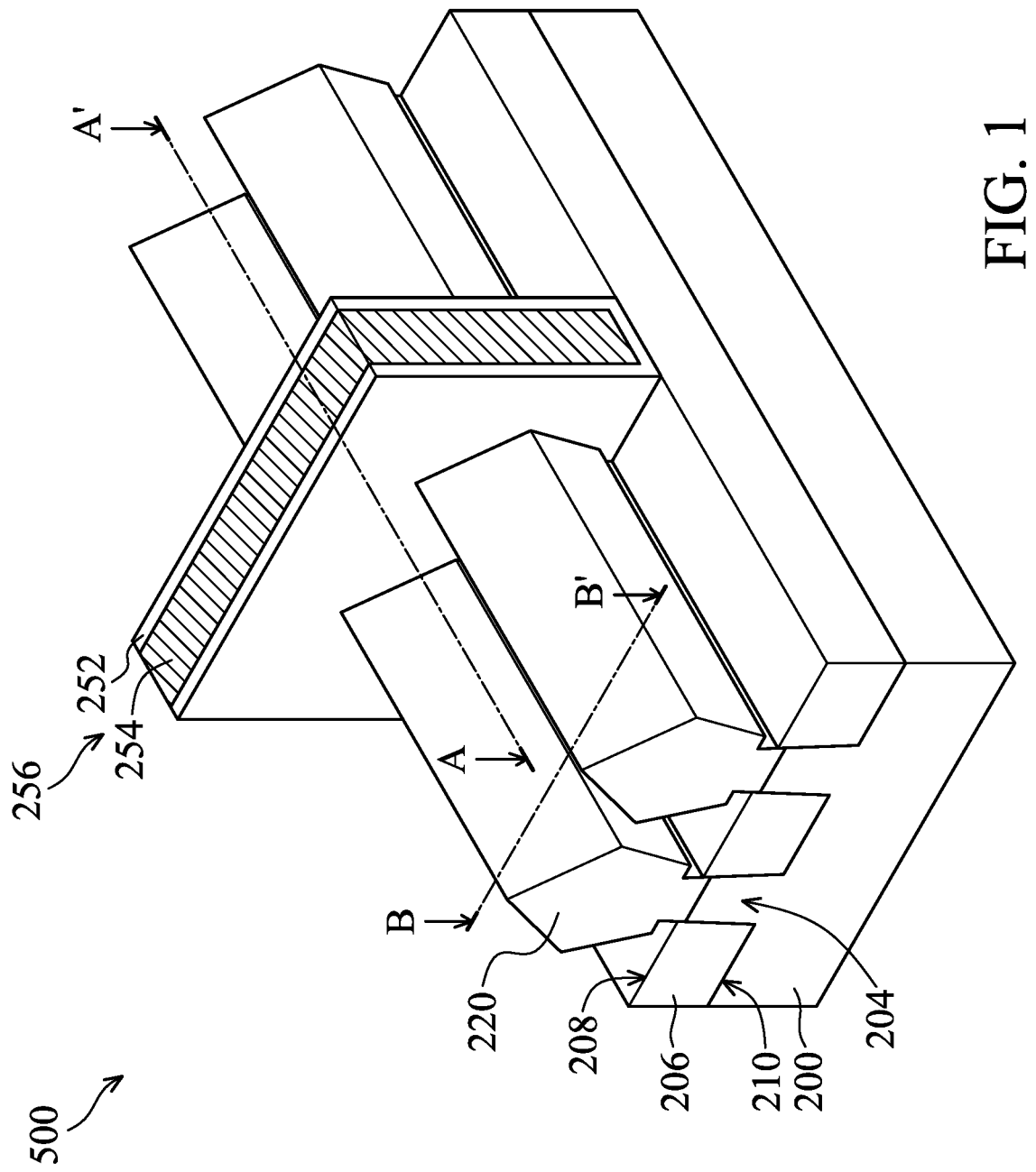
FIG. 1 is a three-dimensional view of an example simplified fin field effect transistor (FinFET) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 illustrates a three-dimensional (3D) view of an example of a simplified fin field effect transistor (FinFET) 500 in accordance with some embodiments. Other aspects not illustrated in or described with respect to FIG. 1 may become apparent from the following figures and description. The FinFET 500 includes a fin structure 204 on a substrate 200. The substrate 200 includes isolation regions 206, and the fin structure 204 protrudes above a top surface 208 of the isolation regions 206. In addition, the fin structure 204 may be formed between the neighboring isolation regions 206. A gate structure 256 including a gate dielectric layer 252 and a gate electrode layer 254 is positioned over the fin structure 204. The gate dielectric layer 252 is positioned along sidewalls and over the top surface of the fin structure 204, and a gate electrode layer 254 is positioned over the gate dielectric layer 252. Source/drain structures 220 are disposed in opposing regions of the fin structure 204 with respect to the gate dielectric layer 252 and the gate electrode layer 254. FIG. 1 further illustrates a reference cross-section A-A' and a reference cross-section B-B' that are used for later figures. The cross-section A-A' may be in a plane along, e.g., a channel in the fin structure 204 between the opposing source/drain structures 220. In addition, the cross-section B-B' may be in a plane along, a width of the fin structure 204.

The source/drain structures 220 may be shared between various transistors, for example. In some examples, the source/drain structures 220 may be connected or coupled to other FinFETs such that the FinFETs are implemented as one functional transistor. For example, if neighboring (e.g., as opposed to opposing) source/drain regions are electrically connected, such as through coalescing the regions by epitaxial growth, one functional transistor may be implemented. Other configurations in other examples may implement other numbers of functional transistors.

Figure 2:
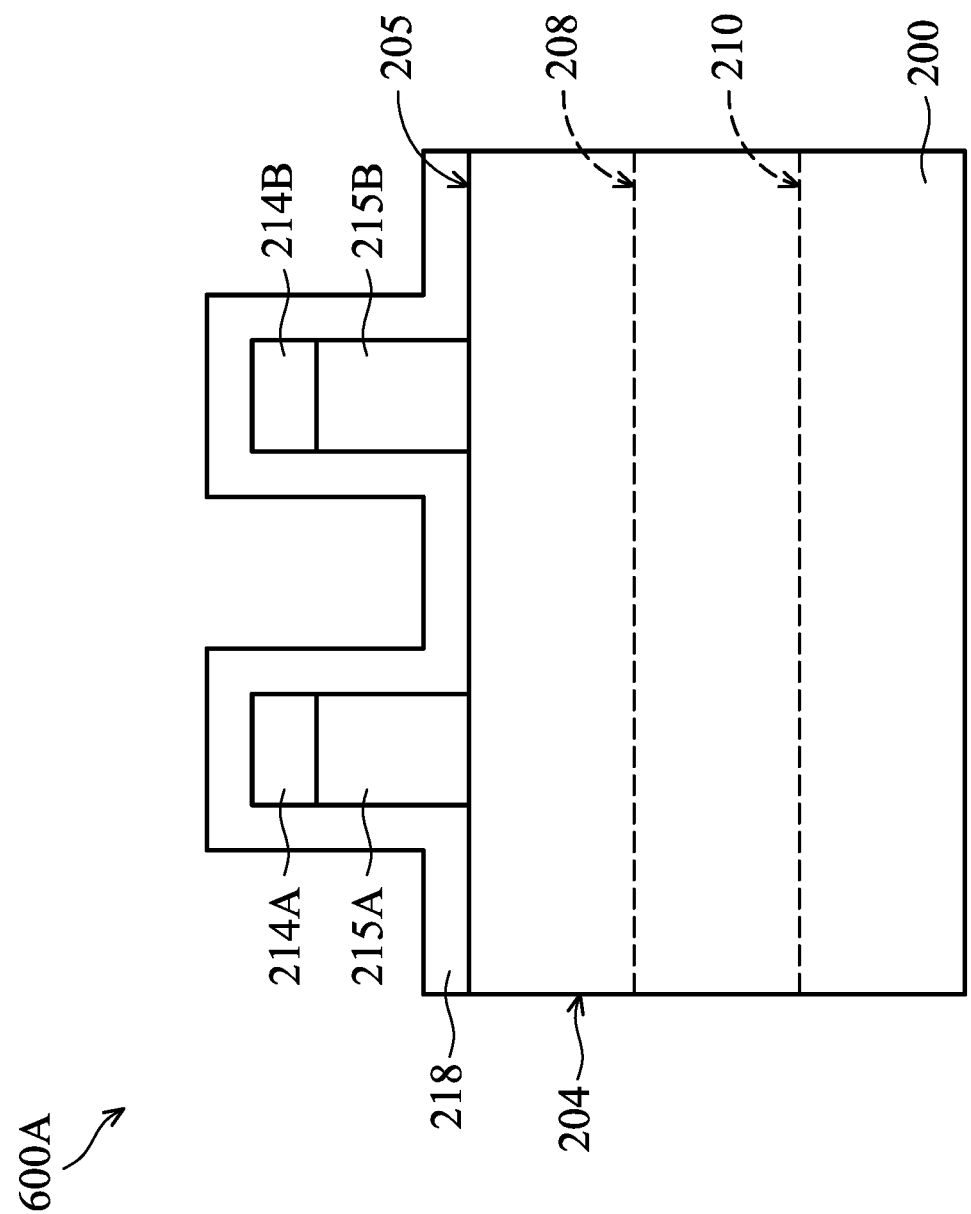
FIG. 2, FIG. 3 and FIG. 4 are cross-sectional views along line A-A' of FIG. 1 showing various stages of a process for forming a semiconductor structure, in accordance with some embodiments.
Figure 3:
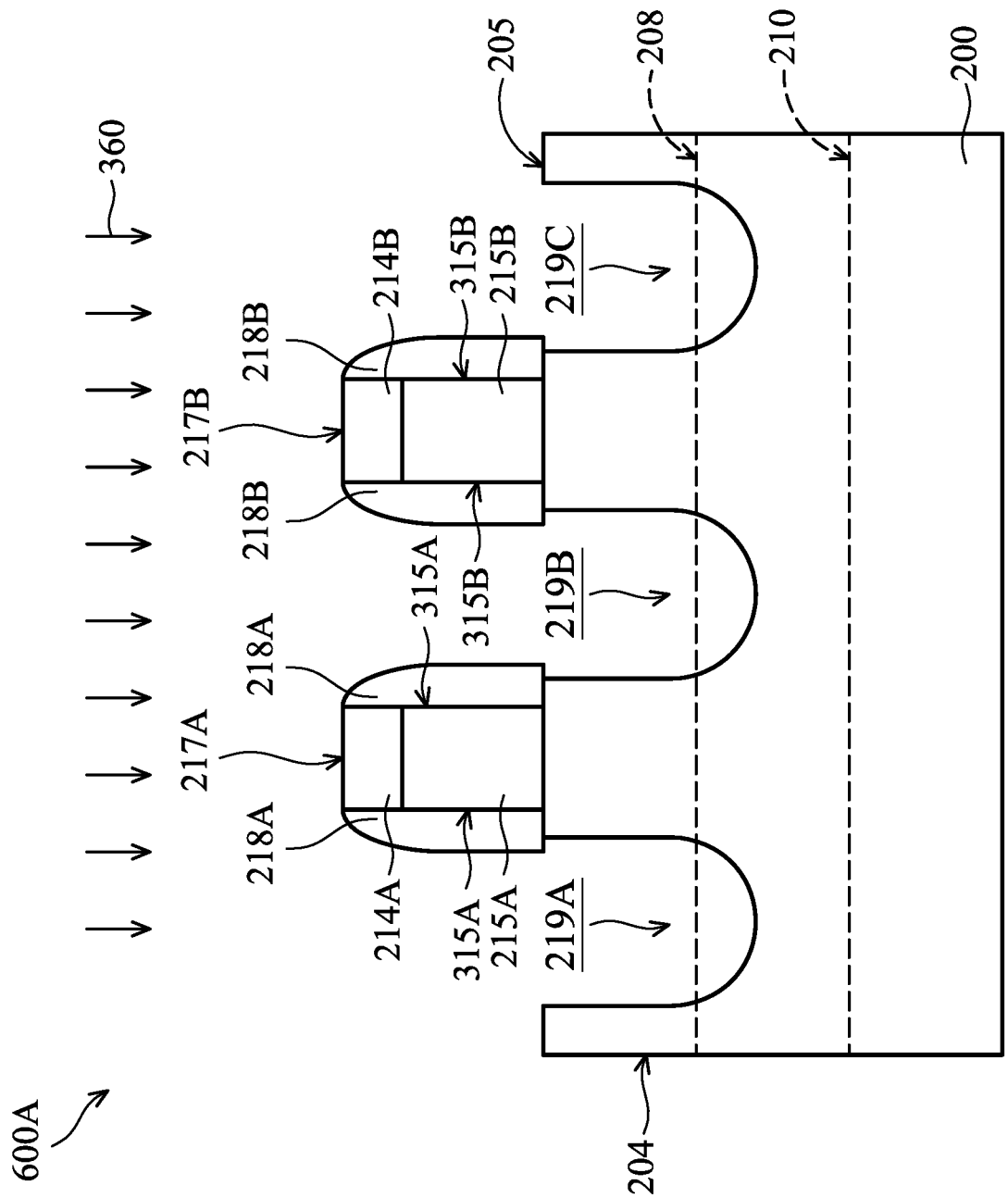
Figure 4:
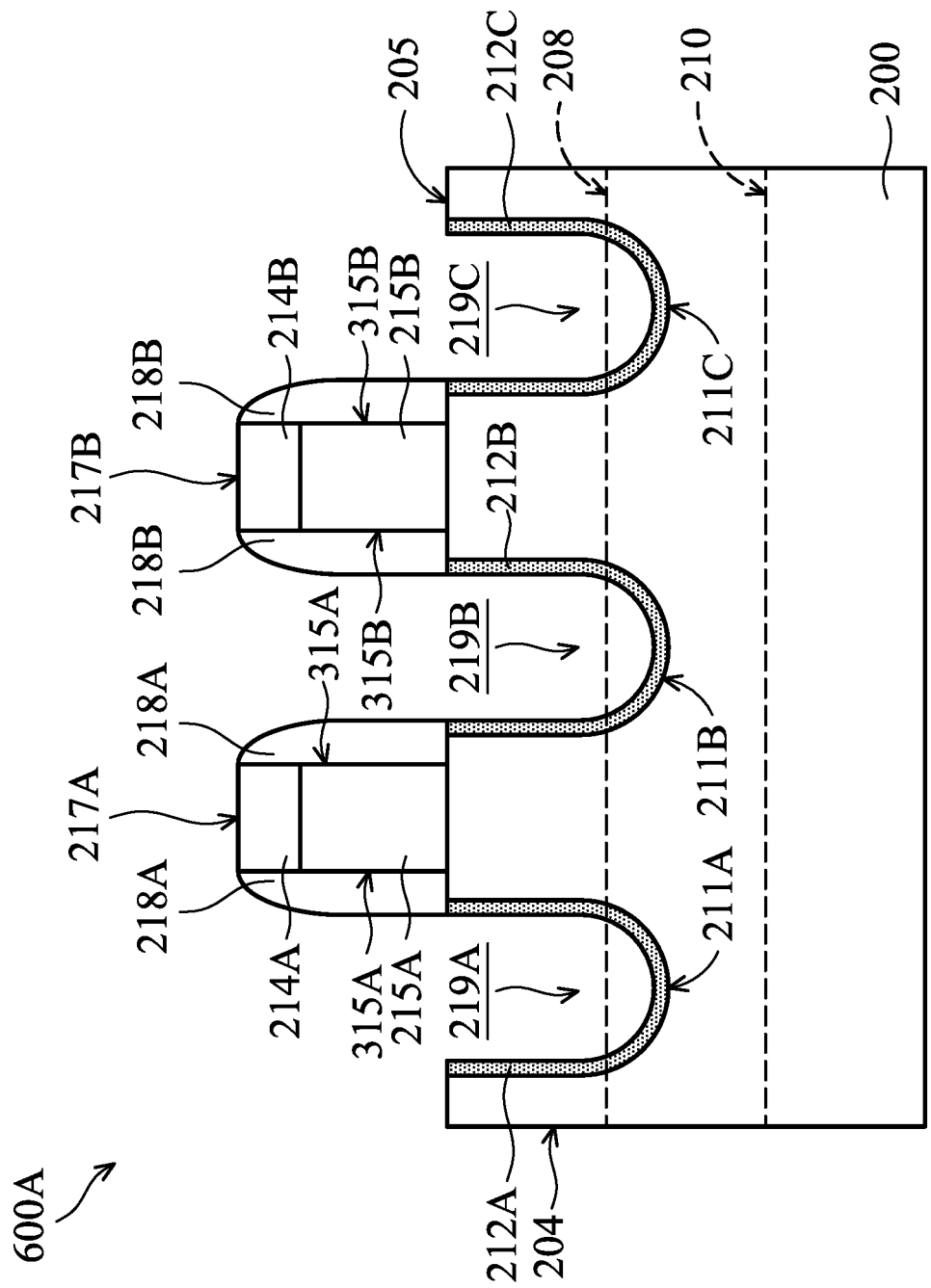
Figure 5A:
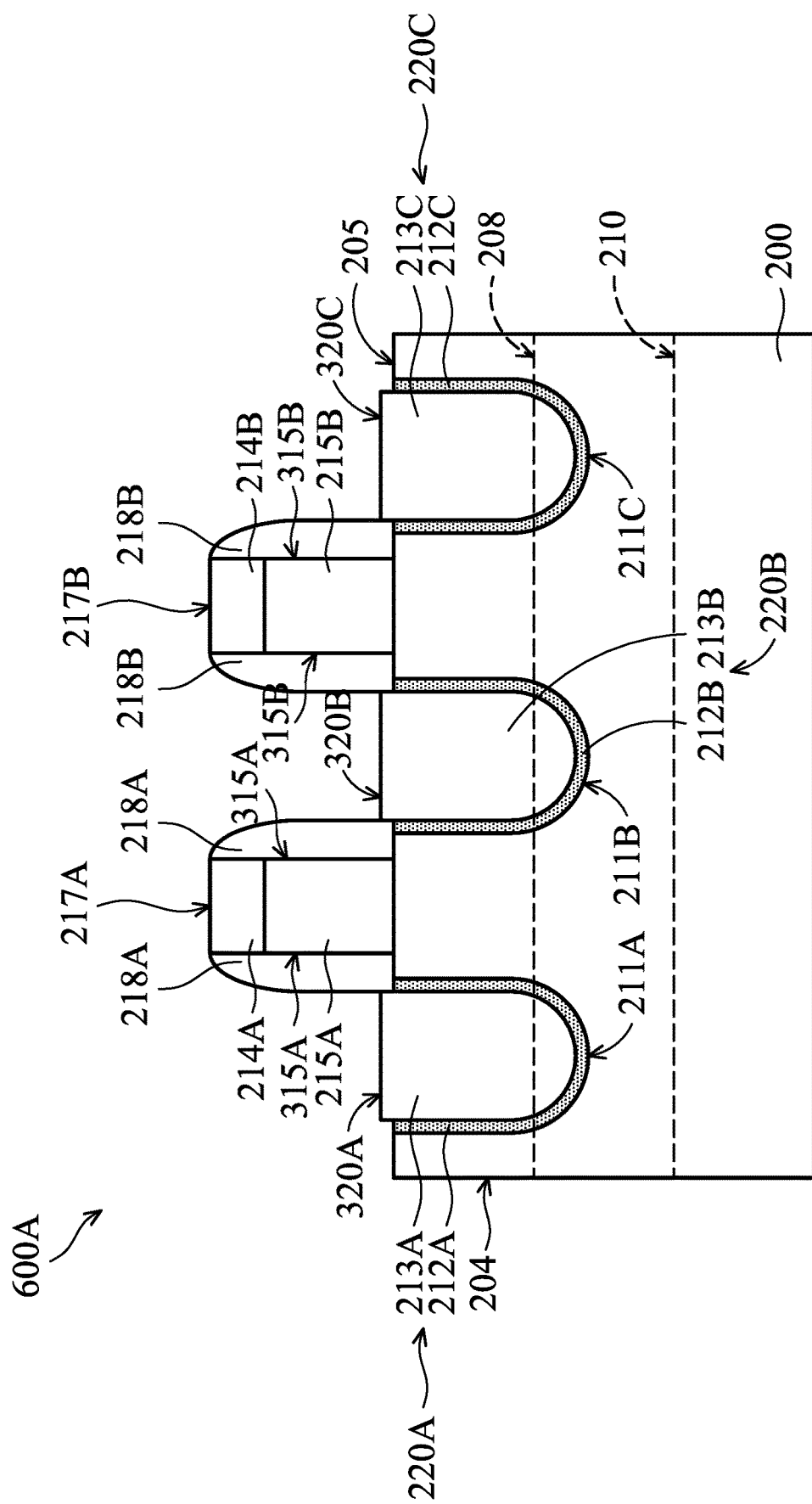
FIG. 5A is a cross-sectional view along line A-A' of FIG. 1 showing a stage of a process for forming a semiconductor structure after the stage shown in FIG. 4, in accordance with some embodiments.
Figure 5B:
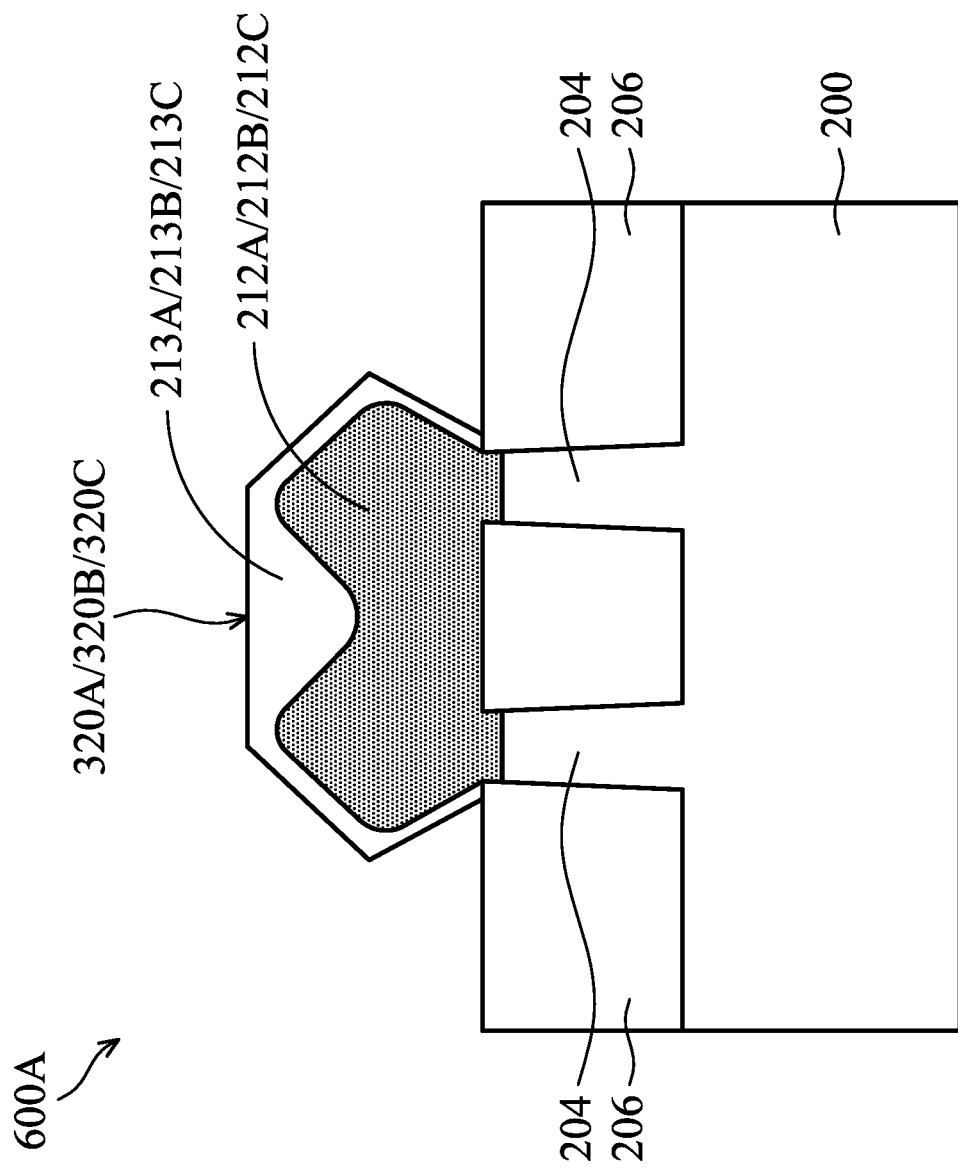
FIG. 5B is a cross-sectional view along line B-B' of FIG. 1 showing a stage of a method of forming a semiconductor structure after the stage shown in FIG. 4, in accordance with some embodiments.

FIG. 2, FIG. 3 and FIG. 4 are cross-sectional views along line A-A' of FIG. 1 showing various stages of a process for forming a semiconductor structure 600A, in accordance with some embodiments. FIG. 5A and FIG. 5B are cross-sectional views along line A-A' and line B-B' of FIG. 1 showing stages of a process for forming a semiconductor structure after the stage shown in FIG. 4. FIG. 6, FIG. 7, FIG. 8, FIG. 9, FIG. 10, FIG. 11 and FIG. 12A are cross-sectional views along line A-A' of FIG. 1 showing various stages of a process for forming a semiconductor structure after the stage shown in FIGS. 5A and 5B.

In some embodiments, a gate-replacement (gate-last) process is employed to fabricate the semiconductor structures 600A, such as a fin field effect transistor (FinFET) (e.g. FinFETs 500A and 500B).

As shown in FIG. 2, the substrate 200 including the fin structure 204 is received. In some embodiments, the substrate 200 may be a semiconductor substrate, such as a bulk semiconductor, a semiconductor-on-insulator (SOI) substrate, or the like, which may be doped (e.g. with a P-type or an N-type dopant) or undoped. The substrate 200 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 200 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the fin structure 204 is formed by performing a patterning process on the substrate 200. The fin structure 204 may be surrounded by trenches (not shown) formed in the substrate 200 by the patterning process. The isolation regions 206 (FIG. 1) may be formed on a bottom surface 210 of each of the trenches. A lower portion of the fin structure 204 is surrounded by the isolation structures, and an upper portion of the fin structure 204 protrudes from a top surface 208 of each of the isolation structures.

After the isolation regions are formed, dummy gate structures 215A and 215B are formed over a top surface 205 of the fin structure 204, as shown in FIG. 2 in accordance with some embodiments. In addition, hard mask layers 214A and 214B are formed on the dummy gate structures 215A and 215B, respectively. In some embodiments, the dummy gate structures cover respective channel regions of the resulting finFETs (e.g. the FinFETs 500A and 500B) on the fin structure 204. In some embodiments, the dummy gate structures 215A and 215B cover the top surface 205 and sidewalls of the fin structure 204, and extend over the isolation region and the substrate 200 outside the fin structure 204.

In some embodiments, each of the dummy gate structures 215A and 215B includes a gate dielectric (not shown) and a gate electrode (not shown) formed over the gate dielectric. In some embodiments, the gate dielectric is silicon dioxide. In some embodiments, the silicon dioxide is a thermally grown oxide. In some embodiments, the gate dielectric is a high dielectric constant (high-k) dielectric material. A high-k dielectric material has a dielectric constant (k) higher than that of silicon dioxide. Examples of high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the gate electrode includes polycrystalline-silicon (poly-Si), poly-crystalline silicon-germanium (poly-SiGe), metallic nitride, metallic silicide, metallic oxide, metal, and other suitable layers. In some embodiments, the gate electrode is made of, for example, polysilicon.

In some embodiments, each of the hard mask layers 214A and 214B includes a single layer structure or a multi-layer structure. In some embodiments, the hard mask layers 214A and 214B are made of silicon oxide, silicon nitride, silicon oxynitride, silicon carbide, another suitable material, or a combination thereof.

In some embodiments, the formation of the dummy gate structures 215A and 215B and the hard mask layers 214A and 214B includes deposition processes and a subsequent patterning process. The deposition processes are performed to deposit a gate dielectric material layer (not shown), a gate electrode material layer (not shown) and a hard mask material (not shown) in sequence. The patterning process is then performed to partially remove the gate dielectric material layer, the gate electrode material layer and a hard mask material. Therefore, the dummy gate structure 215A and the overlying hard mask layer 214A, and the dummy gate structure 215B and the overlying hard mask layer 214B are formed over the fin structure 204. In some embodiments, the deposition process includes a chemical vapor deposition (CVD) process, a physical vapor deposition (PVD) process, an atomic layer deposition (ALD) process, a thermal oxidation process, or another applicable process. In some embodiments, the patterning process includes a photolithography process and a subsequent etching process. In some embodiments, the etching process is a dry etching process.

After the dummy gate structures 215A and 215B and the hard mask layers 214A and 214B are formed, a gate spacer layer 218 is formed over the fin structure 204, the dummy gate structures 215A and 215B and the hard mask layers 214A and 214B, as shown in FIG. 2 in accordance with some embodiments. In addition, the gate spacer layer 218 is conformally formed over the dummy gate structures 215A and 215B. In some embodiments, the gate spacer layer 218 includes a single layer structure or a multi-layer structure. The gate spacer layer 218 may be made of low dielectric constant (low-k) materials (e.g. k<5). In addition, the gate spacer layer 218 may be formed of oxide-free dielectric materials, such as silicon nitride, silicon carbide, silicon carbonitride, another suitable material, or a combination thereof. The gate spacer layer 218 may be deposited using a chemical vapor deposition (CVD) process, a physical vapor deposition (PVD) process, a spin-on process, another applicable process, or a combination thereof. The thickness of the gate spacer layer 218 may be in a range from about 1 nm to about 1 μm.

Afterwards, gate spacers 218A and 218B are formed on opposite sidewall surfaces 315A and 315B of the dummy gate structures 215A and 215B and over the fin structure 204, as shown in FIG. 3 in accordance with some embodiments. Each of the gate spacers 218A and 218B may include a single layer structure or a multi-layer structure. In some embodiments, the gate spacers 218A and 218B are formed by an etching process. The etching process is performed to remove the gate spacer layer 218 (FIG. 2) above a top surface 217A of the hard mask layer 214A, a top surface 217B of the hard mask layer 214B and the top surface 205 of the fin structure 204. In addition, the etching process is performed until the top surface 205 of the fin structure 204 is exposed. In some embodiments, the etching process may include a dry etch process. The thickness of each of the gate spacers 218A and 218B may be in a range from about 1 nm to about 1 μm.

After the gate spacers 218A and 218B are formed, an etching process 360 is performed to remove portions of the fin structure 204 that are not covered by the hard mask layers 214A and 214B, the dummy gate structures 215A and 215B and the gate spacers 218A and 218B, as shown in FIG. 3 in accordance with some embodiments. In some embodiments, the etching process 360 is performed to form recesses 219A, 219B and 219C adjacent the gate spacers 218A and 218B and in the fin structure 204. In addition, bottoms of the recesses 219A, 219B and 219C may be positioned below the top surface 208 of each of the isolation structures. The recesses 219A, 219B and 219C are configured to provide positions of a source/drain structures formed in the subsequent processes. In some embodiments, the etching process 360 is a dry etching process. In some embodiments, etching gases used in the etching process 360 include HBr, NF3, O2 and other suitable etching gases.

Afterwards, first source/drain epitaxial layer 212A, 212B and 212C are epitaxial grown lining surfaces 211A, 211B and 211C of the fin structure 204 in the recesses 219A, 219B and 219C, as shown in FIG. 4 in accordance with some embodiments. In some embodiments, the first source/drain epitaxial layer 212A, 212B and 212C are conformally formed along profiles of in the recesses 219A, 219B and 219C (i.e. the surfaces 211A, 211B and 211C of the fin structure 204 in the recesses 219A, 219B and 219C) by an epitaxial growth process. In addition, the first source/drain epitaxial layer 212A, 212B and 212C are in contact with the fin structure 204. Furthermore, the first source/drain epitaxial layer 212A, 212B and 212C may partially overlap the gate spacers 218A and 218B.

In some embodiments, each of the first source/drain epitaxial layers 212A, 212B and 212C may include a silicon epitaxial layer with a first N-type dopant. For example, the first N-type dopant may include arsenic (As), carbon (C) or phosphorous (P). For example, the first source/drain epitaxial layers 212A, 212B and 212C may be formed of SiAs, SiCP, SiC, SiP or a combination thereof. The concentration of the first N-type dopant in the first source/drain epitaxial layers 212A, 212B and 212C may be in a range from 1E16 atoms/cm3 about to about 5E21 atoms/cm3. In some embodiments, the epitaxial growth process includes an epitaxial process, such as a selective epitaxial growth (SEG) process, CVD deposition techniques (e.g. vapor-phase epitaxy (VPE) and/or ultra-high vacuum CVD (UHV-CVD)), molecular beam epitaxy, or another suitable epitaxial process. The epitaxial growth process may be performed using a precursor including AsH3. The thickness of each of the first source/drain epitaxial layers 212A, 212B and 212C may be in a range from about 1 Å to about 300 nm.

After first source/drain epitaxial layers 212A, 212B and 212C are formed, the second source/drain epitaxial layers 213A, 213B and 213C are epitaxial grown over the first source/drain epitaxial layer 212A, 212B and 212C and filling the recesses 219A, 219B and 219C, as shown in FIG. 5A and FIG. 5B in accordance with some embodiments. In some embodiments, the first source/drain epitaxial layer 212A and the overlying second source/drain epitaxial layer 213A collectively form a source/drain structure 220A. Similarly, the first source/drain epitaxial layer 212B and the overlying second source/drain epitaxial layer 213B may collectively form a source/drain structure 220B. The first source/drain epitaxial layer 212C and the overlying second source/drain epitaxial layer 213C may collectively form a source/drain structure 220C. In some embodiments, the source/drain structures 220A, 220B and 220C are formed in the fin structure 204 and adjacent to the gate spacers 218A and 218B. The lattice constant of the first source/drain epitaxial layers 212A, 212B and 212C are different from the lattice constant of the second source/drain epitaxial layers 213A, 213B and 213C. The lattice constant of the source/drain structures 220A, 220B and 220C are different from the lattice constant of the fin structure 204. In some embodiments, the source/drain structures 220A, 220B and 220C may have a curved shape, a diamond shape, another applicable shape, or a combination thereof.

In some embodiments, the first source/drain epitaxial layers 212A, 212B and 212C are connected to portions of the second source/drain epitaxial layers 213A, 213B and 213C below the top surface 205 of the fin structure 204. The portions of the second source/drain epitaxial layers 213A, 213B and 213C below the top surface 205 of the fin structure 204 are in contact with the first source/drain epitaxial layers 212A, 212B and 212C. In addition, the second source/drain epitaxial layers 213A, 213B and 213C are separated from the fin structure 204 through the first epitaxial layers 212A, 212B and 212C of the source/drain structures 220A, 220B and 220C. Top surfaces 320A, 320B and 320C of the second source/drain epitaxial layers 213A, 213B and 213C may serve as top surfaces 320A, 320B and 320C of the source/drain structures 220A, 220B and 220C. In addition, the top surfaces 320A, 320B and 320C of the source/drain structures 220A, 220B and 220C may be positioned above or leveled with the top surface 205 of the fin structure 204. Furthermore, the source/drain structures 220A (or 220B, 220C) on neighboring fin structures 204 may be merged, as shown in FIG. 5B in accordance with some embodiments.

In some embodiments, the second source/drain epitaxial layers 213A, 213B and 213C are formed of SiCP, SiC, SiP or a combination thereof. In addition, the composition of the second source/drain epitaxial layers 213A, 213B and 213C may be different from the composition of the first source/drain epitaxial layers 212A, 212B and 212C. For example, each of the second source/drain epitaxial layers 213A, 213B and 213C may include a silicon epitaxial layer with a second N-type dopant. The second N-type dopant in the second source/drain epitaxial layers 213A, 213B and 213C may be different form the first N-type dopant in the first source/drain epitaxial layers 212A, 212B and 212C. In some embodiments, an atomic radius of the first N-type dopant is greater than an atomic radius of the second N-type dopant. Therefore, the lattice constant of each of the first source/drain epitaxial layers 212A, 212B and 212C is different from (greater than) the lattice constant of each of the second source/drain epitaxial layers 213A, 213B and 213C of the source/drain structures 220A, 220B and 220C. For example, when the first N-type dopant is arsenic (As), the second N-type dopant is phosphorous (P). For example, when the first source/drain epitaxial layers 212A, 212B and 212C are formed of SiAs, the second source/drain epitaxial layers 213A, 213B and 213C are formed of SiCP, SiC, SiP or a combination thereof.

In some embodiments, the second source/drain epitaxial layers 213A, 213B and 213C are formed by an epitaxial growth process. The epitaxial growth process may include an epitaxial process, such as a selective epitaxial growth (SEG) process, CVD deposition techniques (e.g. vapor-phase epitaxy (VPE) and/or ultra-high vacuum CVD (UHV-CVD)), molecular beam epitaxy, or another suitable epitaxial process. The thickness of each of the second source/drain epitaxial layers 213A, 213B and 213C may be in a range from about 10 nm to about 1 μm. The thickness of each of the second source/drain epitaxial layers 213A, 213B and 213C may be greater than the thickness of each of the first source/drain epitaxial layers 212A, 212B and 212C. In some embodiments, the thickness of each of the second source/drain epitaxial layers 213A, 213B and 213C may be one order to three orders of magnitude greater than the thickness of each of the first source/drain epitaxial layers 212A, 212B and 212C. For example, the ratio of the thickness of each of the second source/drain epitaxial layers 213A, 213B and 213C to the thickness of each of the first source/drain epitaxial layers 212A, 212B and 212C may be in a range from 10:1 to 1000:1.

In some embodiments, the first source/drain epitaxial layers 212A, 212B and 212C surround lower portions of the second source/drain epitaxial layers 213A, 213B and 213C in the fin structure 204. In addition, the first N-type dopant in the first source/drain epitaxial layers 212A, 212B and 212C may have an atomic radius larger than the atomic radius of the second N-type dopant in the second source/drain epitaxial layers 213A, 213B and 213C. The first N-type dopant in the first source/drain epitaxial layers 212A, 212B and 212C may be hard to diffuse into the fin structure 204. In addition, the first source/drain epitaxial layers 212A, 212B and 212C may prevent the second N-type dopant in the second source/drain epitaxial layers 213A, 213B and 213C from penetrating through the first source/drain epitaxial layers 212A, 212B and 212C and being diffused into the fin structure 204 (e.g. the channel region of the FinFET). Therefore, the drain induced barrier lowering (DIBL) effect can be reduced. In addition, the electrical conductivity of the first source/drain epitaxial layers 212A, 212B and 212C (e.g., SiAs) may be better than the electrical conductivity of the second source/drain epitaxial layers 213A, 213B and 213C (e.g., SiCP). Therefore, on resistance (Ron) of the FinFET may be improved (reduced).

Figure 6:
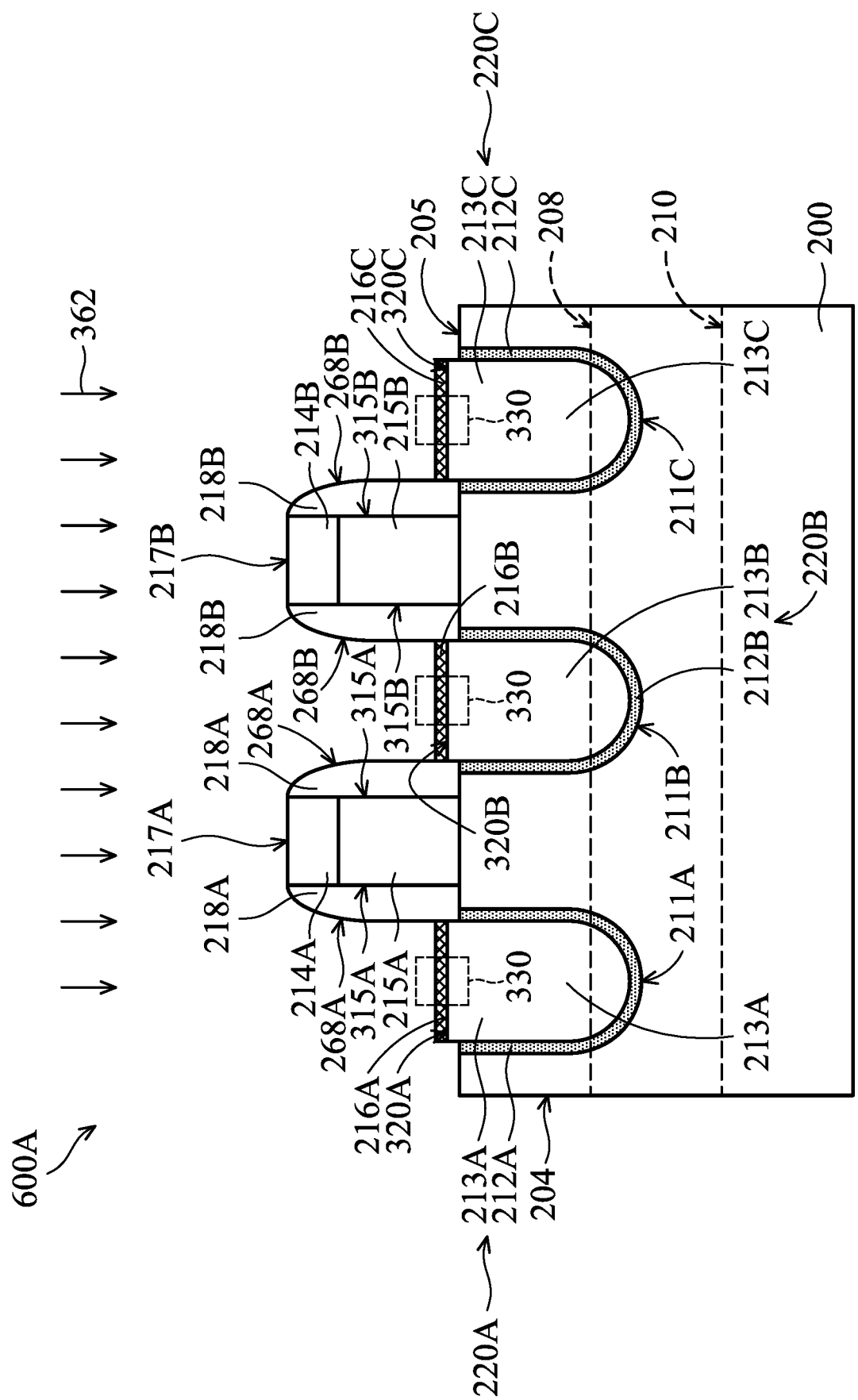
FIG. 6, FIG. 7, FIG. 8, FIG. 9, FIG. 10, FIG. 11 and FIG. 12A are cross-sectional views along line A-A' of FIG. 1 showing various stages of a process for forming a semiconductor structure after the stage shown in FIGS. 5A and 5B, in accordance with some embodiments.

Afterwards, blocking layers 216A, 216B and 216C are formed on the top surfaces 320A, 320B and 320C of the source/drain structures 220A, 220B and 220C, as shown in FIG. 6 in accordance with some embodiments. For example, portions of the source/drain structures 220A, 220B and 220C may be transformed into the blocking layers 216A, 216B and 216C. Therefore, the top surfaces 320A, 320B and 320C of the source/drain structures 220A, 220B and 220C is positioned below the blocking layers 216A, 216B and 216C. In addition, the blocking layers 216A, 216B and 216C may not be formed on sidewall surfaces 268A and 268B of the gate spacers 218A and 218B and the top surfaces 217A and 217B of the hard mask layers 214A and 214B.

In some embodiments, each of the blocking layers 216A, 216B and 216C includes a polymer layer, such as a polysiloxane layer. The blocking layers 216A, 216B and 216C may be formed by a gas phase deposition process 362, such as a chemical vapor deposition (CVD) process. For example, the gas phase deposition process 362 may be performed using a precursor including methyl group (CH3) in gas phase.

Figure 13:
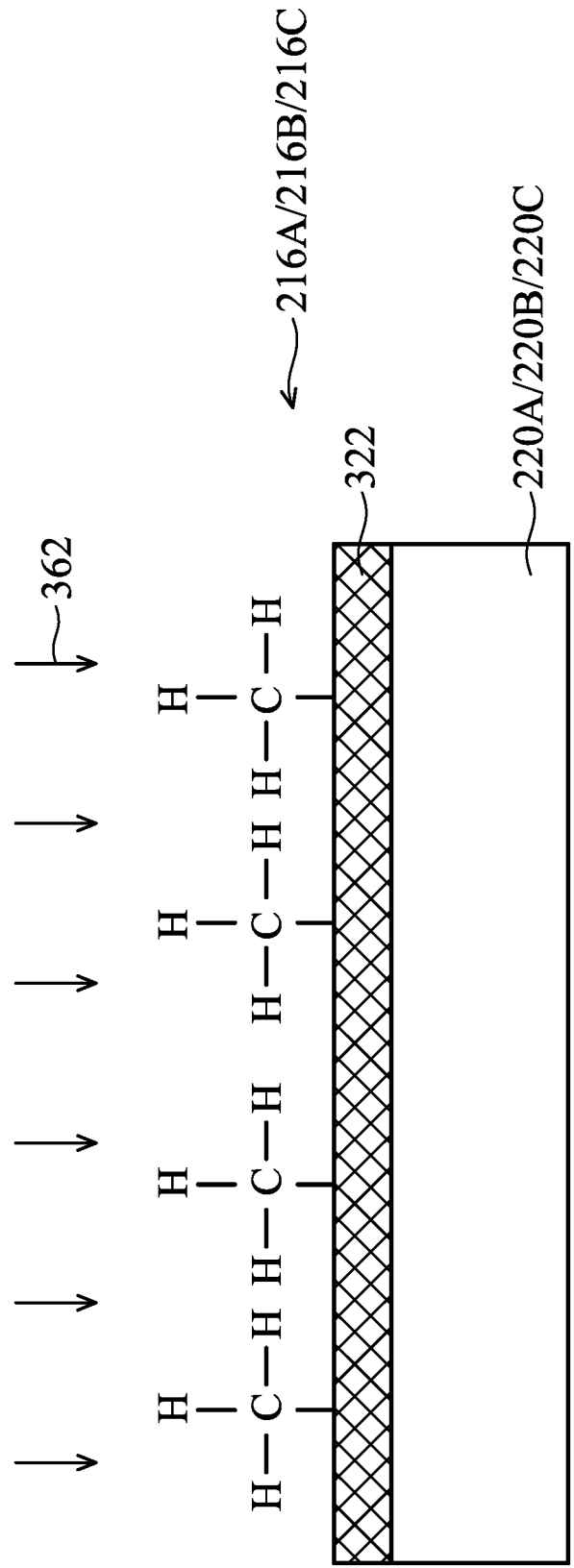
FIG. 13 is an enlarged view of FIG. 6, showing a blocking layer formed on a source/drain structure, in accordance with some embodiments.

FIG. 13 is an enlarged view of portions 330 of FIG. 6. FIG. 13 shows the blocking layers 216A, 216B and 216C formed on the source/drain structures 220A, 220B and 220C. In some embodiments, native oxide layers 322 are formed on the source/drain structures 220A, 220B and 220C. The native oxide layers 322, for example, silicon dioxide (SiO2), may be formed due to the exposure of the top surfaces 320A, 320B and 320C of the source/drain structures 220A, 220B and 220C. As shown in FIG. 13, the precursor (or the polymer form the precursor) and the native oxide layers 322 may form Si—C bonds during the gas phase deposition process 362. Therefore, the blocking layers 216A, 216B and 216C may be formed on the top surfaces 320A, 320B and 320C of the source/drain structures 220A, 220B and 220C after performing the gas phase deposition process 362. When the gate spacers 218A and 218B and the hard mask layers 214A and 214B are made of silicon nitride based materials, the blocking layer may not be formed on the sidewall surfaces 268A and 268B of the gate spacers 218A and 218B and on the top surfaces 217A and 217B of the hard mask layers 214A and 214B after performing the gas phase deposition process 362. In some embodiments, as shown in FIG. 13, each of the blocking layers 216A, 216B and 216C may include the native oxide layer 322 and the methyl group.

Figure 7:
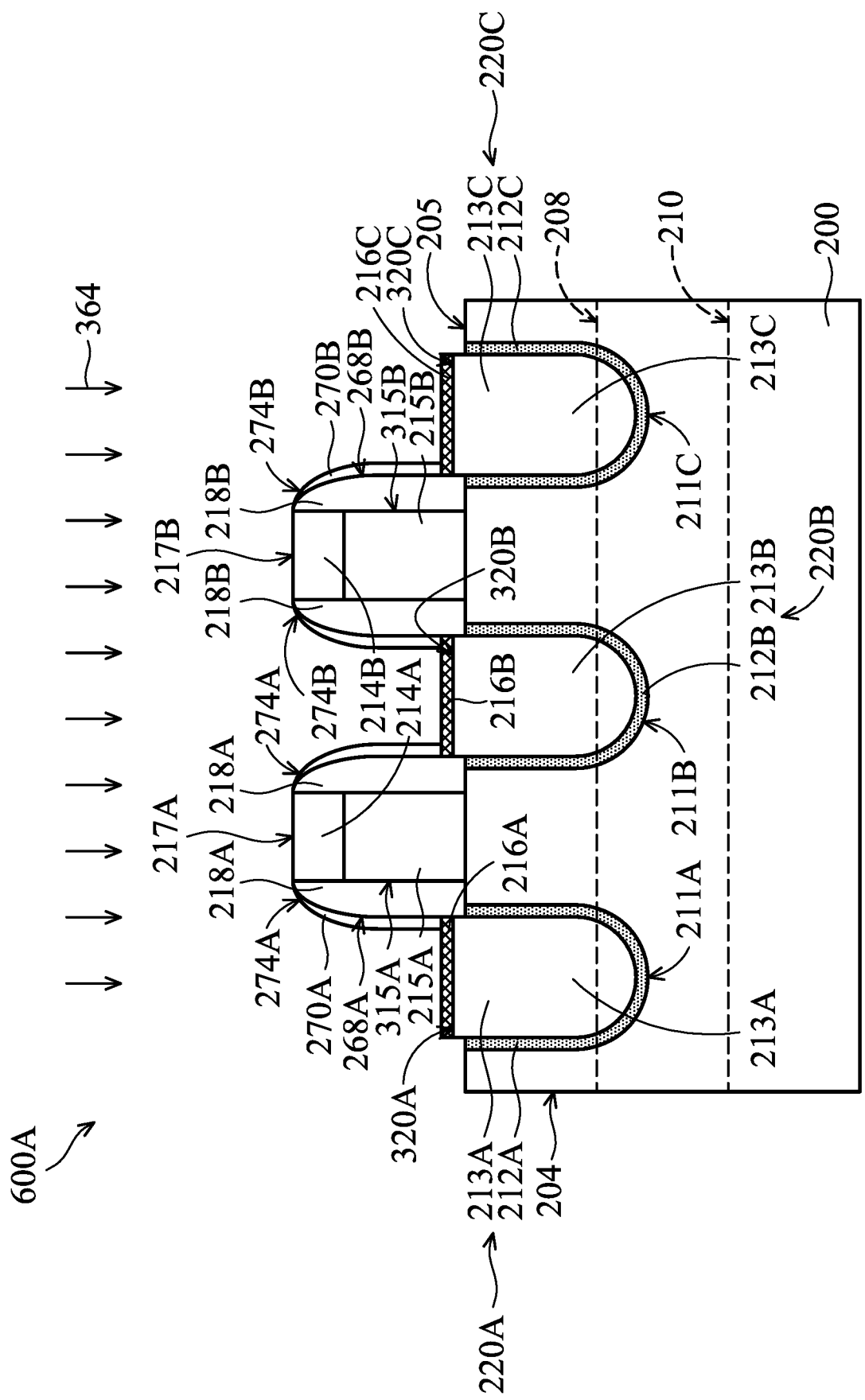

Afterwards, dielectric spacers 270A and 270B are formed on sidewall surfaces 268A and 268B of the spacers 218A and 218B by performing a deposition process 364, as shown in FIG. 7 in accordance with some embodiments. The dielectric spacers 270A and 270B are formed over the source/drain structures 220A, 220B and 220C. In addition, the dielectric spacers 270A and 270B may be separated from the source/drain structures 220A, 220B and 220C. During the deposition process 364, the blocking layers 216A, 216B and 216C may serve as inhibitors to prevent the dielectric spacers 270A and 270B formed in contact with the top surfaces 320A, 320B and 320C of the source/drain structures 220A, 220B and 220C. Therefore, the dielectric spacers 270A and 270B are selectively formed on the sidewall surfaces 268A and 268B of the spacers 218A and 218B rather than on the top surfaces 320A, 320B and 320C of the source/drain structures 220A, 220B and 220C. In addition, the dielectric spacers 270A and 270B may be positioned directly over the source/drain structures 220A, 220B and 220C. In some other embodiments, the dielectric spacers 270A and 270B may be formed covering the top surfaces 217A and 217B of the hard mask layers 214A and 214B.

The dielectric spacers 270A and 270B may be made of silicon oxide (SiO2), silicon nitride (SiN), silicon oxynitride (SiON), silicon carbon oxynitride (SiCON), silicon carbonitride (SiCN), another dielectric material or a combination thereof. The dielectric spacers 270A and 270B and the gate spacers 218A and 218B may be formed of different materials. For example, when the dielectric spacers 270A and 270B are formed of silicon nitride (SiN), the gate spacers 218A and 218B may be formed of silicon carbonitride (SiCN).

In some embodiments, the deposition process 364 includes atomic layer deposition (ALD) process or another applicable process. The thickness of each of the dielectric spacers 270A and 270B may be in a range from about 1 Å to about 100 nm. The thickness of each of the gate spacers 218A and 218B may be greater than the thickness of each of the dielectric spacers 270A and 270B. For example, the thickness of each of the gate spacers 218A and 218B may be one order to fourth orders of magnitude greater than the thickness of each of the dielectric spacers 270A and 270B. For example, the ratio of the thickness of each of the gate spacers 218A and 218B to the thickness of each of the dielectric spacers 270A and 270B may be in a range from 10:1 to 10000:1.

In some other embodiments, the dielectric spacers 270A and 270B may be formed by using an implantation process to dope dopants in a portion of the spacers 218A and 218B from the (outer) sidewall surfaces 268A and 268B of the spacers 218A and 218B. During the implantation process, the blocking layers 216A, 216B and 216C may serve as masks to prevent the dopants from being doped in the source/drain structures 220A, 220B and 220C. The dopants used in the implantation process may include nitrogen, carbon or a combination thereof.

Figure 8:
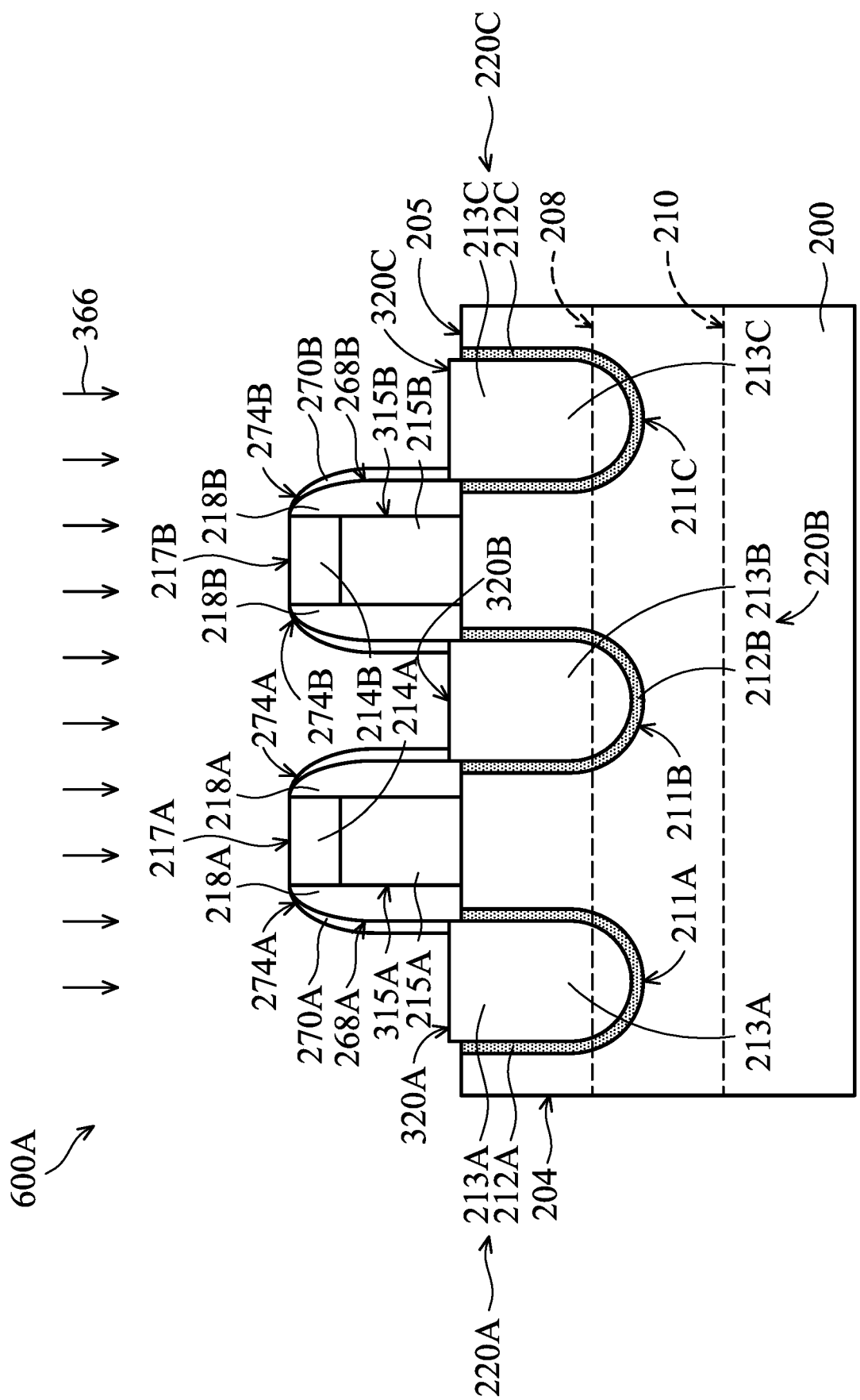

After the dielectric spacers 270A and 270B are formed, the blocking layers 216A, 216B and 216C are removed from the top surfaces 320A, 320B and 320C of the source/drain structures 220A, 220B and 220C by a removal process 366, as shown in FIG. 8 in accordance with some embodiments. The top surfaces 320A, 320B and 320C of the source/drain structures 220A, 220B and 220C are exposed after performing the removal process 366. In some embodiments, the removal process 366 includes a baking process and a subsequent wet cleaning process. For example, the baking process may help to break, for example, Si—C bond contained in the blocking layers 216A, 216B and 216C. In some embodiments, the baking process may sublimate at least a portion of the blocking layers 216A, 216B and 216C, and the sublimated portion of the blocking layers 216A, 216B and 216C may be carried away by an applicable gas (e.g., H2). The baking process may be performed at a temperature in a range from about 200° C. to about 400° C. For example, the wet cleaning process may include a sulfuric acid-hydrogen peroxide mixture (SPM) cleaning process to remove the remaining portion of the blocking layers 216A, 216B and 216C off the source/drain structures 220A, 220B and 220C. The SPM solution may be a 3:1 mixture of concentrated sulfuric acid (H2SO4) with hydrogen peroxide (H2O2).

Figure 9:
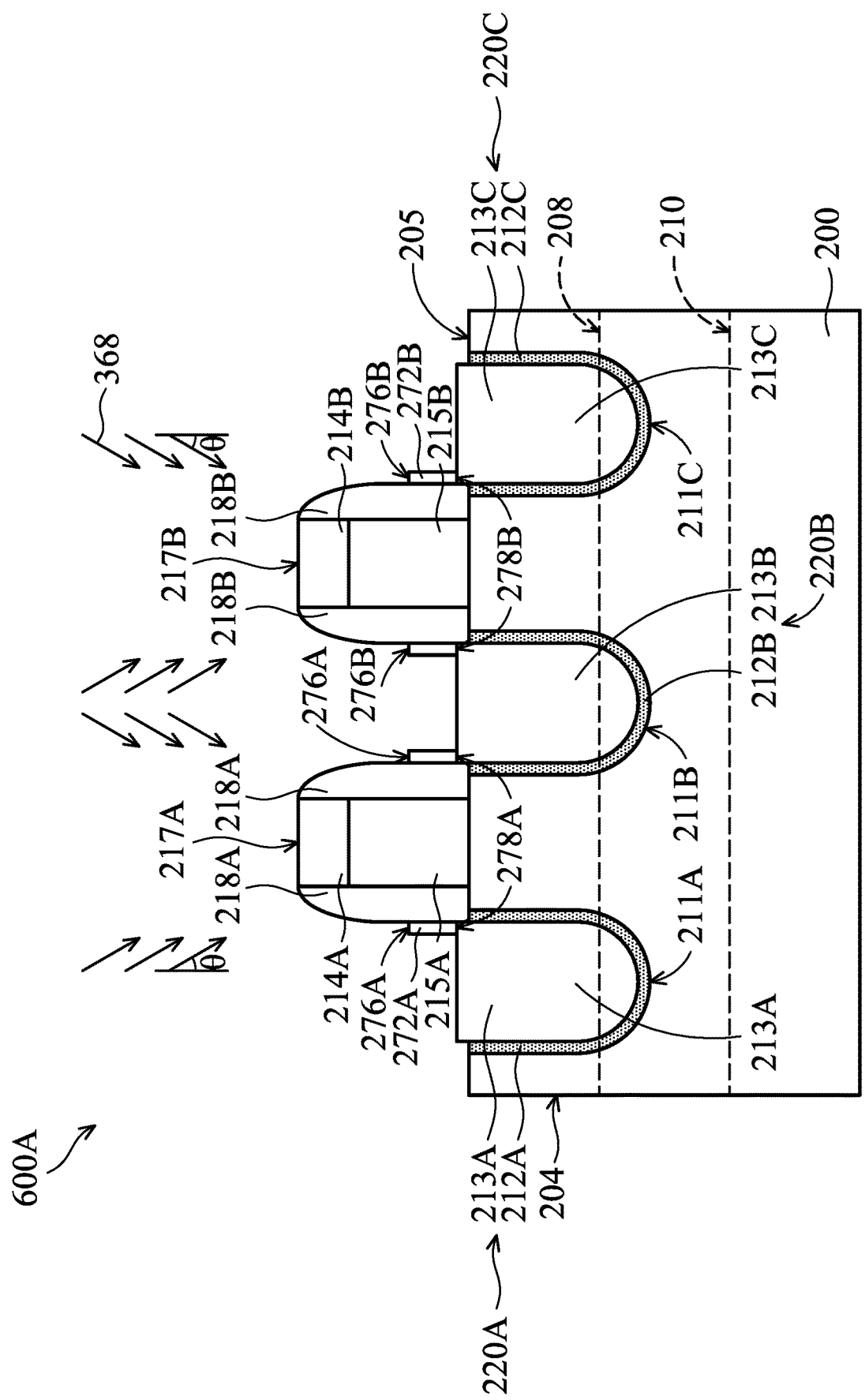

Afterwards, dielectric spacers 272A and 272B are formed covering a portion of the (outer) sidewall surfaces 268A and 268B (FIG. 8) of the spacers 218A and 218B by a plasma etching process 368, as shown in FIG. 9 in accordance with some embodiments. The plasma etching process 368 may be performed with a tilt angle θ to remove a portion of the dielectric spacers 270A and 270B from top surfaces 274A and 274B of the dielectric spacers 270A and 270B (FIG. 8). In some embodiments, the tilt angle θ may be larger than 15 degrees (e.g., 15 degrees <θ<90 degrees) to avoid or reduce the damage to the source/drain structures 220A, 220B and 220C during the plasma etching process 368. In some embodiments, a lithography process may be performed to form a mask layer (not shown in the figures). The mask layer may cover and protect the source/drain structures 220A, 220B and 220C but expose the portion of the dielectric spacers 270A and 270B intended to be removed by the plasma etching process 368. The dielectric spacers 272A and 272B may be positioned directly over the second source/drain epitaxial layers 213A, 213B and 213C of the source/drain structures 220A, 220B and 220C. In addition, top surfaces 276A and 276B of the dielectric spacers 272A and 272B may be positioned between top surfaces (the position is leveled with the interface between the dummy gate structure 215A (or 215B) and the hard mask layer 214A (or 214B)) and bottom surfaces (the position is leveled with the top surface 205 of the fin structure 204) of the dummy gate structures 215A and 215B. Furthermore, bottom surfaces 278A and 278B of the dielectric spacers 272A and 272B may be positioned directly above the second source/drain epitaxial layers 213A, 213B and 213C. In some other embodiments, the plasma etching process 368 is optional.

In some embodiments, the plasma etching process 368 may be performed using a process gas including BF2, BF4, CF4, O2, SF6, Cl2, etc. The plasma etching process 368 may be performed using a precursor including BF2, BF4, CF4, O2, SF6, Cl2, etc. The plasma etching process 368 may be performed at a temperature in a range from about 400° C. to about 600° C. In addition, the plasma etching process 368 may be performed with a radio-frequency (RF) power in a range from about 30 KW to about 1000 KW.

Figure 10:
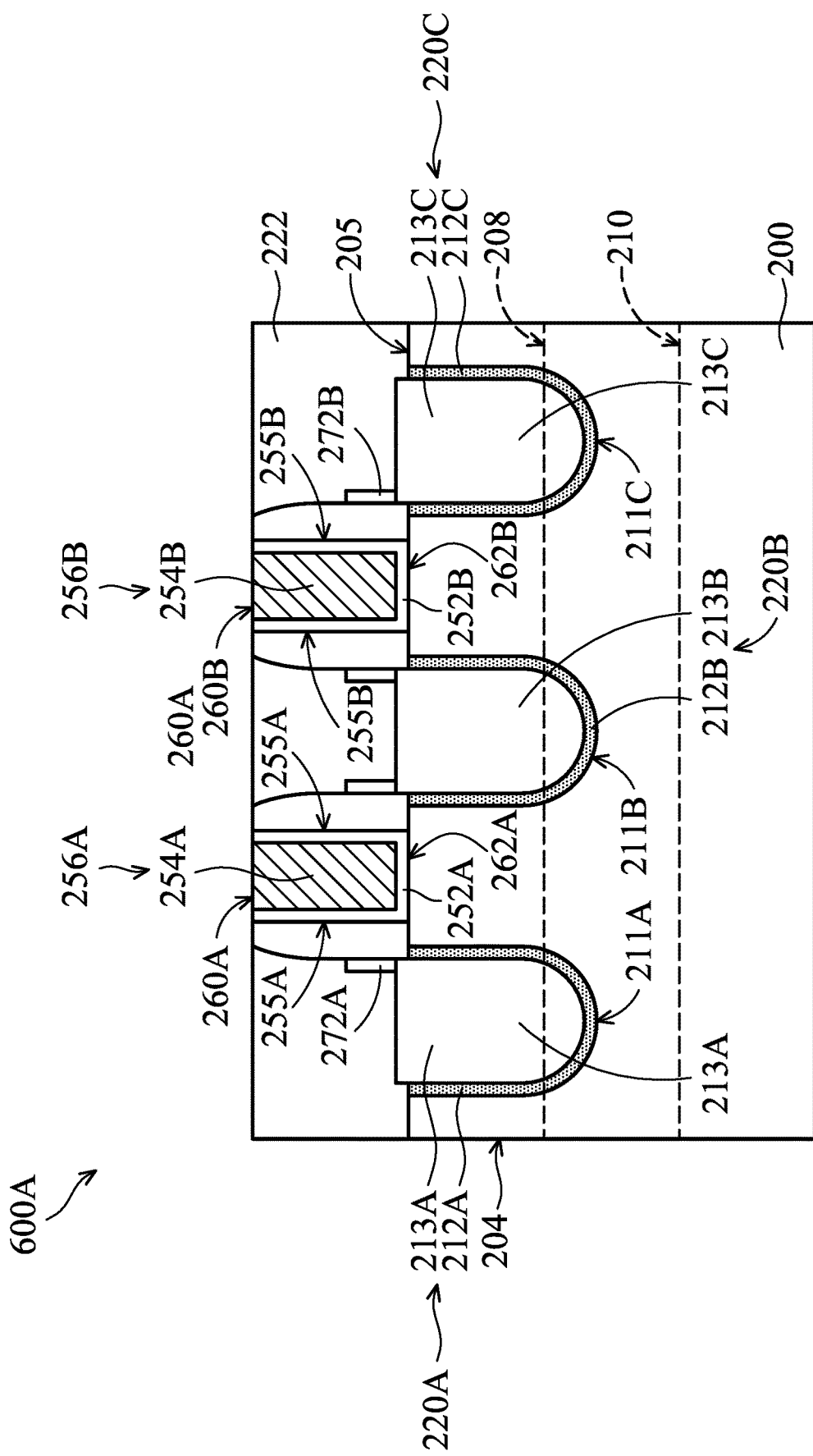

Afterwards, a dielectric layer 222 (such as an inter-layer dielectric (ILD) layer) is formed over the fin structure 204, the dummy gate structures 215A and 215B, the gate spacers 218A and 218B, the dielectric spacers 272A and 272B, and the source/drain structures 220A, 220B and 220C, as shown in FIG. 10 in accordance with some embodiments. The dielectric layer 222 may fill gaps between the dummy gate structures 215A and 215B. In addition, the top surfaces 276A and 276B of the dielectric spacers 272A and 272B are covered by the dielectric layer 222.

In some embodiments, a deposition process is performed to form the dielectric layer 222. Afterwards, a planarization process is performed to level the top surfaces of the dielectric layer 222, the gate spacers 218A and 218B, and the dummy gate structures 215A and 215B, as shown in FIG. 10.

In some embodiments, the dielectric layer 222 is made of a dielectric material such as silicon oxide, phosphosilicate glass (PSG), borosilicate glass (BSG), boron-doped phosphosilicate glass (BPSG), undoped silicate glass (USG), carbon-doped silicate glass, silicon nitride or silicon oxynitride. In some embodiments, the dielectric layer 222 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide (SiO2). In some embodiments, ELK dielectric material is deposited by a plasma enhanced chemical vapor deposition (PECVD) process or by a spin coating process.

In some embodiments, the deposition process of the dielectric layer 222 includes a plasma enhanced chemical vapor deposition (CVD) process, a low pressure CVD process, an atomic layer deposition (ALD) process, flowable CVD (FCVD process), a spin-on coating process, or another applicable process. In some embodiments, the planarization process includes a chemical mechanical polishing (CMP) process, a grinding process, an etching process, another applicable process, or a combination thereof.

After the dielectric layer 222 is formed, metal gate structures 256A and 256B are formed to replace the dummy gate structure 215A and 215B using a removal process, a deposition processes and a subsequent planarization process, and as shown in FIG. 10 in accordance with some embodiments. In some embodiments, the metal gate structure 256A surrounded by the gate spacers 218A includes a gate dielectric layer 252A and a gate electrode layer 254A over the gate dielectric layer 252A. Similarly, the metal gate structure 256B surrounded by the gate spacers 218B may include a gate dielectric layer 252B and a gate electrode layer 254B over the gate dielectric layer 252B. In some embodiments, the gate spacers 218A are positioned on opposite sidewall surfaces 255A of the metal gate structure 256A, and the gate spacers 218B are positioned on opposite sidewall surfaces 255B of the metal gate structure 256B. In addition, the top surfaces 276A and 276B of the dielectric spacers 272A and 272B may be positioned between top surfaces 260A and 260B and bottom surfaces 262A and 262B of the metal gate structures 256A and 256B.

In some embodiments, the gate dielectric layers 252A and 252B include a single layer or multiple layers. In some embodiments, the gate dielectric layers 252A and 252B have a U-shape from a cross-sectional view or a rectangular shape from a plane view. In some embodiments, the gate dielectric layers 252A and 252B are formed of silicon oxide, silicon nitride, or a high-k dielectric material (k>7.0) including a metal oxide or a silicate of Hf, Al, Zr, La, Mg, Ba, Ti, Pb, or a combination thereof. The formation methods of gate dielectric layers 252A and 252B may include molecular beam deposition (MBD), atomic layer deposition (ALD), plasma enhanced CVD (PECVD), and the like.

In some embodiments, the gate electrode layers 254A and 254B are made of a metal-containing material such as TiN, TaN, TaC, Co, Ru, Al, combinations thereof, or multi-layers thereof, and are formed by a deposition process, such as electroplating, electroless plating, or another suitable method.

In some embodiments, a work function layer (not shown) may be formed in the metal gate structures 256A and 256B. The work function layer may include N-work-function metal or P-work-function metal. The P-type work function layer may include TiN, TaN, Ru, Mo, Al, WN, ZrSi2, MoSi2, TaSi2, NiSi2, WN, another suitable P-type work function material, or a combination thereof. The N-type work function layer may include Ti, Ag, TaAl, TaAlC, TiAlN, TaC, TaCN, TaSiN, Mn, Zr, another suitable N-type work function material, or a combination thereof. In some embodiments, as shown in FIG. 10, the work function layer in the metal gate structures 256A and 256B may include N-work-function metal.

Figure 11:
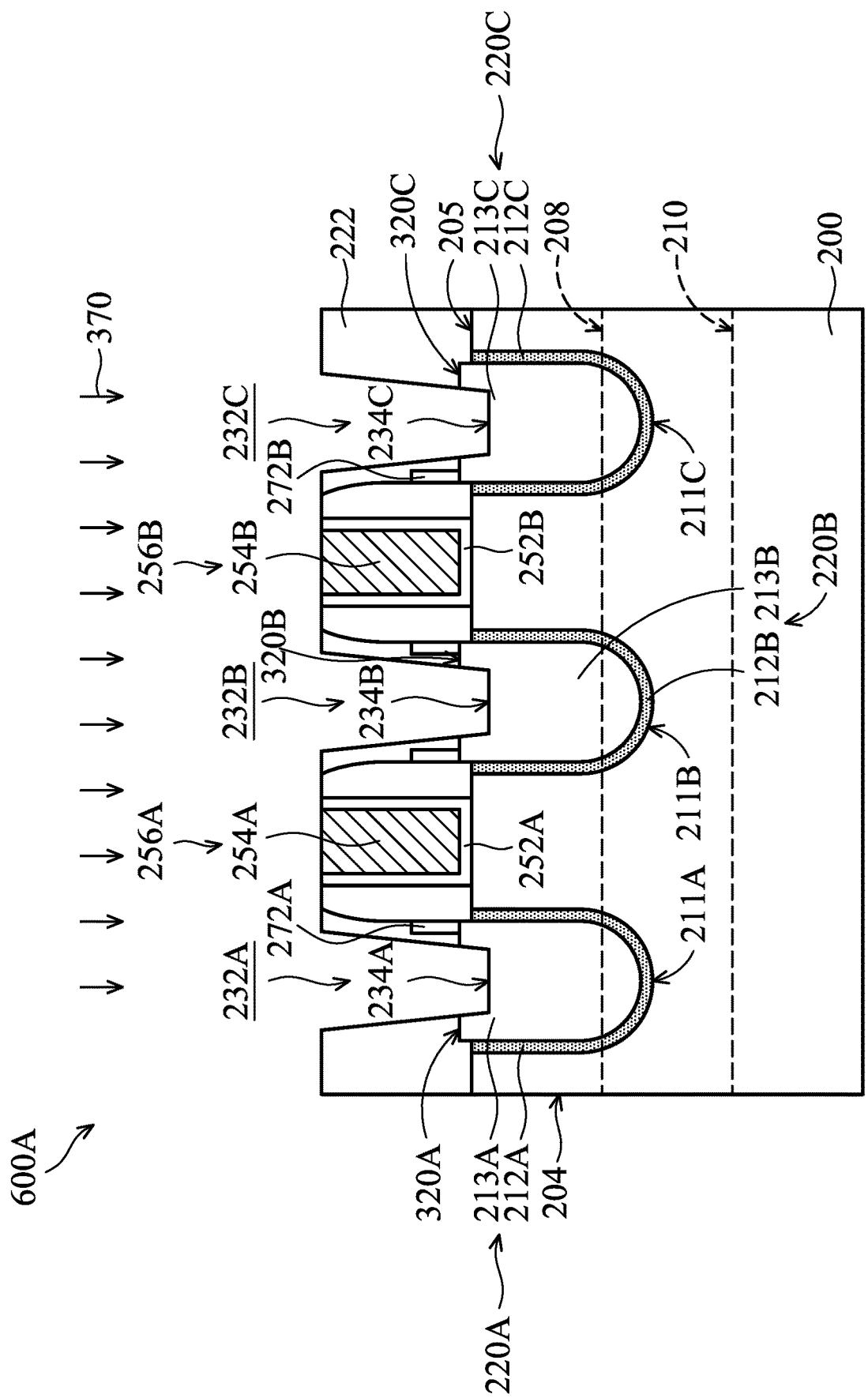

Afterwards, a patterning process 370 is performed to form openings 232A, 232B and 232C in the dielectric layer 222, as shown in FIG. 11 in accordance with some embodiments. The openings 232A, 232B and 232C are formed passing through the dielectric layer 222 to expose the source/drain structures 220A, 220B and 220C.

The patterning process 370 may include a photolithography process and a subsequent etching process. The photolithography process may be performed to form a mask layer, which may be a photo-sensitive layer such as photoresist, over the dielectric layer 226. The mask layer may have openings directly above to the positions of the source/drain structures 220A, 220B and 220C. The photolithography process may include photoresist coating (e.g. spin-on coating), soft baking, mask aligning, exposure, post-exposure baking, developing the photoresist, rinsing and drying (e.g. hard baking). In some embodiments, the etching process is a dry etching process. In addition, etching gases used in the etching process include fluorine-containing (F-containing) gases. After the openings 232A, 232B and 232C are formed, the mask layer may be removed by etching or any other suitable method.

In some embodiments, the dielectric spacers 272A and 272B are formed on the outer sidewalls of the gate spacers 218A and 218B. The dielectric spacers 272A and 272B can help to increase the distance between the subsequent contact plugs and metal gate structures. Therefore, the patterning process 370 of the openings 232A, 232B and 232C may have a wider process window. For example, bottom surfaces 234A, 234B and 234C of the openings 232A, 232B and 232C may have wider widths (along the channel length direction) while the widths of the openings 232A, 232B and 232C located close to a top surface of the dielectric layer 222 can be kept. Therefore, the bottom surfaces 234A, 234B and 234C of the openings 232A, 232B and 232C may be positioned lower the top surfaces 320A, 320B and 320C of the source/drain structures 220A, 220B and 220C. In addition, the dielectric spacers 272A and 272B may be used to replace a contact etch stop layer (CESL).

Figure 12A:
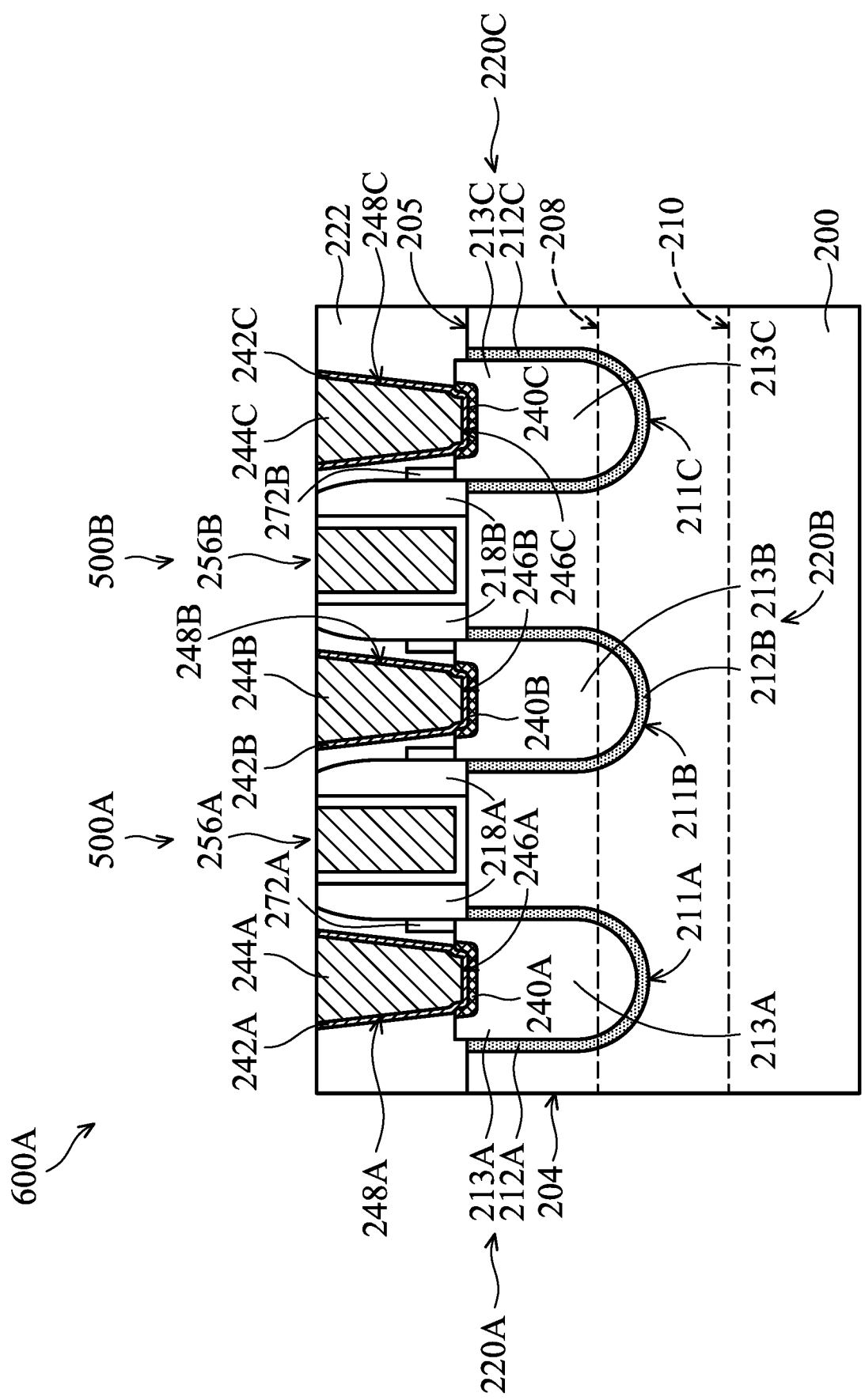
Figure 12B:
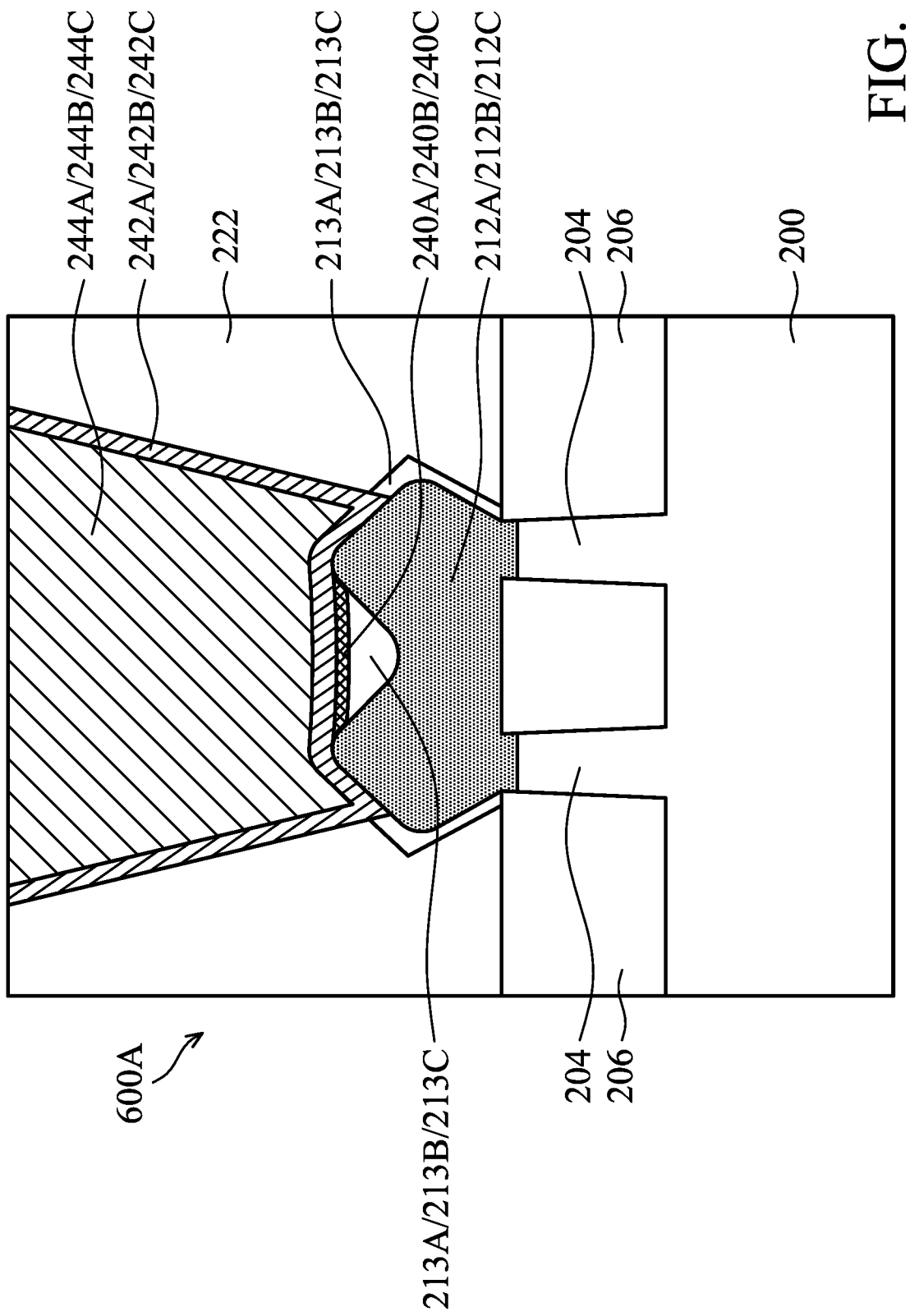
FIG. 12B is a cross-sectional view along line B-B' of FIG. 1 showing a stage of a method of forming a semiconductor structure after the stage shown in FIG. 11, in accordance with some embodiments.

Afterwards, source/drain silicide layers 240A, 240B and 240C are formed on the source/drain structures 220A, 220B and 220C in the openings 232A, 232B and 232C by a silicidation process, as shown in FIGS. 12A and 12B in accordance with some embodiments. As shown in FIG. 12A, the source/drain silicide layers 240A and 240B may be separated from the metal gate structures 256A and 256B through the dielectric layer 222, the dielectric spacers 272A and 272B and the gate spacers 218A and 218B along the longitudinal direction of the fin structure 204. In addition, as shown in FIG. 12A, the source/drain silicide layers 240A and 240B may be separated from the gate spacers 218A and 218B through the dielectric spacers 272A and 272B along the longitudinal direction of the fin structure 204.

In some embodiments, the silicidation process includes a metal material deposition process and an annealing process performed in sequence. In some embodiments, the deposition process of the silicidation process includes a physical vapor deposition (PVD) process, an atomic layer deposition (ALD) process, or another applicable process. In some embodiments, the annealing process of the silicidation process is performed at a temperature in a range from about 300° C. to about 800° C. After the annealing process, the unreacted metal material is removed.

In some embodiments, the source/drain silicide layers 240A, 240B and 240C are formed of one or more of cobalt silicide (e.g. CoSi, CoSi2, Co2Si, Co3Si; collectively "Co silicide"), titanium silicide (e.g. Ti5Si3, TiSi, TiSi2, TiSi3, Ti6Si4; collectively "Ti silicide"), nickel silicide (e.g. Ni3Si, Ni31Si12, Ni2Si, Ni3Si2, NiSi, NiSi2; collectively "Ni silicide"), copper silicide (e.g. Cu17Si3, Cu56Si11, Cu5Si, Cu33Si7, Cu4Si, Cu19Si6, Cu3Si, Cu87Si13; collectively "Cu silicide"), tungsten silicide (W5Si3, WSi2; collectively "W silicide"), and molybdenum silicide (Mo3Si, Mo5Si3, MoSi2; collectively "Mo silicide"). The thickness of each of the source/drain silicide layers 240A, 240B and 240C may be in a range from about 1 Å to about 500 nm.

In some embodiments, the bottom surfaces 234A, 234B and 234C of the openings 232A, 232B and 232C (FIG. 11) may be positioned lower the top surfaces 320A, 320B and 320C of the source/drain structures 220A, 220B and 220C. The source/drain silicide layers 240A, 240B and 240C may be formed in the positions leveled with or lower than the top surface 205 of the fin structure 204. In addition, the dielectric spacers 272A and 272B may serve as a block layer to prevent the silicide from extruding from the subsequent source/drain silicide layer 240A, 240B and 240C to the adjacent metal gate structures 256A and 256B.

Afterwards, contact barrier layers 242A, 242B and 242C are formed covering sidewall surfaces and bottom surfaces of the openings 232A, 232B and 232C (FIG. 11). The contact barrier layers 242A, 242B and 242C are formed covering the source/drain structures 220A, 220B and 220C exposed by the openings 232A, 232B and 232C, as shown in FIGS. 12A and 12B in accordance with some embodiments. In addition, contact plugs 244A, 244B and 244C are formed filling the openings 232A, 232B and 232C (FIG. 11). The contact plugs 244A, 244B and 244C are formed passing through the dielectric layer 222 and positioned over the source/drain structures 220A, 220B and 220C.

As shown in FIG. 12A, the contact barrier layers 242A, 242B and 242C may be conformally formed over the source/drain silicide layers 240A, 240B and 240C and line the sidewall surfaces and the bottom surfaces of the openings 232A, 232B and 232C (FIG. 11). In some embodiments, the bottom surfaces of the contact barrier layers 242A, 242B and 242C are respectively in direct contact with the source/drain silicide layers 240A, 240B and 240C. In some embodiments, as shown in FIGS. 12A and 12B, the contact barrier layers 242A, 242B and 242C are respectively in direct contact with the first source/drain epitaxial layers 212A, 212B and 212C, and the contact barrier layers 242A, 242B and 242C are respectively in direct contact with the second source/drain epitaxial layers 213A, 213B and 213C.

As shown in FIG. 12A, sidewall surfaces 248A, 248B and 248C and bottom surfaces 246A, 246B and 246C of the contact plugs 244A, 244B and 244C are covered by the contact barrier layers 242A, 242B and 242C, respectively. The dielectric spacers 272A and 272B surround portions of the sidewall surfaces 248A, 248B and 248C of the contact plugs 244A, 244B and 244C. In addition, the contact plugs 244A, 244B and 244C are separated from the metal gate structures 256A and 256B through the contact barrier layers 242A, 242B and 242C, the dielectric layer 222, the dielectric spacers 272A and 272B and the gate spacers 218A and 218B along the longitudinal direction of the fin 204 structure. Furthermore, the contact plugs 244A, 244B and 244C may be electrically connected to the source/drain structures 220A, 220B and 220C. Therefore, the contact plugs 244A, 244B and 244C may serve as source/drain contact plugs.

In some embodiments, the contact barrier layers 242A, 242B and 242C and the contact plugs 244A, 244B and 244C may be formed by deposition processes and a subsequent planarization process such as CMP. The contact barrier layers 242A, 242B and 242C may include an electrically conductive material such as titanium (Ti), titanium nitride (TiN), tantalum (Ta), tantalum nitride (TaN), nickel (Ni), nickel nitride (NiN), or the like, and may be formed by a CVD process, such as plasma-enhanced CVD (PECVD). However, other alternative processes, such as sputtering or metal organic chemical vapor deposition (MOCVD), physical vapor deposition (PVD), atomic layer deposition (ALD), may also be used. The contact plugs 244A, 244B and 244C may be made of a conductive material, such as copper (Cu), aluminum (Al), tungsten (W), titanium (Ti), titanium nitride (TiN), tantalum (Ta), tantalum nitride (TaN), or another applicable material, and may be formed by any suitable deposition method, such as PVD, CVD, ALD, plating (e.g. electroplating). The thickness of each of the contact barrier layers 242A, 242B and 242C may be in a range from about 1 Å to about 20 Å. The height of each of the contact plugs 244A, 244B and 244C may be in a range from about 20 Å to about 500 nm.

After performing the aforementioned processes, a FinFET 500A and a FinFET 500B are formed. In some embodiments, the FinFET 500A and the FinFET 500B are N-type FinFETs. Moreover, a semiconductor structure 600A including the FinFET 500A and the FinFET 500B is formed, as shown in FIG. 12A in accordance with some embodiments.

In some embodiments, the semiconductor structure 600A includes the N-type FinFET (e.g. the FinFET 500A and the FinFET 500B). The source/drain structure (e.g. the source/drain structures 220A, 220B and 220C) of the N-type FinFET may be composed by the first source/drain epitaxial layer (e.g. the first source/drain epitaxial layers 212A, 212B and 212C) with the first N-type dopant and the second source/drain epitaxial layer (e.g. the second source/drain epitaxial layers 213A, 213B and 213C) with the second N-type dopant. The first source/drain epitaxial layer may serve as a source/drain epitaxial liner layer in contact with the fin structure 204. The first source/drain epitaxial layer may surround the lower portion of the second source/drain epitaxial layer in the fin structure 204. In addition, the atomic radius of the first N-type dopant may be greater than the atomic radius the second N-type dopant. When the semiconductor structure 600A is processed in the thermal processes performed after the formation of the source/drain structure, first N-type dopant (e.g. As) in the first source/drain epitaxial layer may suppress the second N-type dopant (e.g. P) in the second source/drain epitaxial layer diffusing into the fin structure 204. Because the atomic weight of the first N-type dopant is heavier than that of the second N-type dopant, the first N-type dopant is hard to diffuse into the channel region of the FinFET. Therefore, the drain induced barrier lowering (DIBL) effect can be reduced. In addition, the electrical conductivity of the first source/drain epitaxial layers 212A, 212B and 212C (e.g., SiAs) may be better than the electrical conductivity of the second source/drain epitaxial layers 213A, 213B and 213C (e.g., SiCP). Therefore, on resistance (Ron) of the FinFET may be improved (reduced).

In some embodiments, the semiconductor structure 600A includes the dielectric spacer (e.g. the dielectric spacers 272A and 272B) on the lower portion of the outer sidewall surface (e.g. the sidewall surfaces 268A and 268B) of the gate spacer (e.g. the gate spacers 218A and 218B). The dielectric spacer may be used to replace the CESL and help to increase the process window of the contact hole (e.g. the openings 232A, 232B and 232C in the dielectric layer 222). The distance between the contact plug and the adjacent metal gate structure (e.g. the metal gate structures 256A and 256B) may be further reduced. In addition, the source/drain silicide layer (e.g. the source/drain silicide layers 240A and 240B) may be formed in a lower position than the top surfaces of the source/drain structure (e.g. the source/drain structures 220A, 220B and 220C). Therefore, the dielectric spacer may serve as a block layer to prevent the silicide from extruding from the subsequent source/drain silicide layer to the adjacent metal gate structure. The process yield of the semiconductor structure 600A may be improved.

Figure 14:
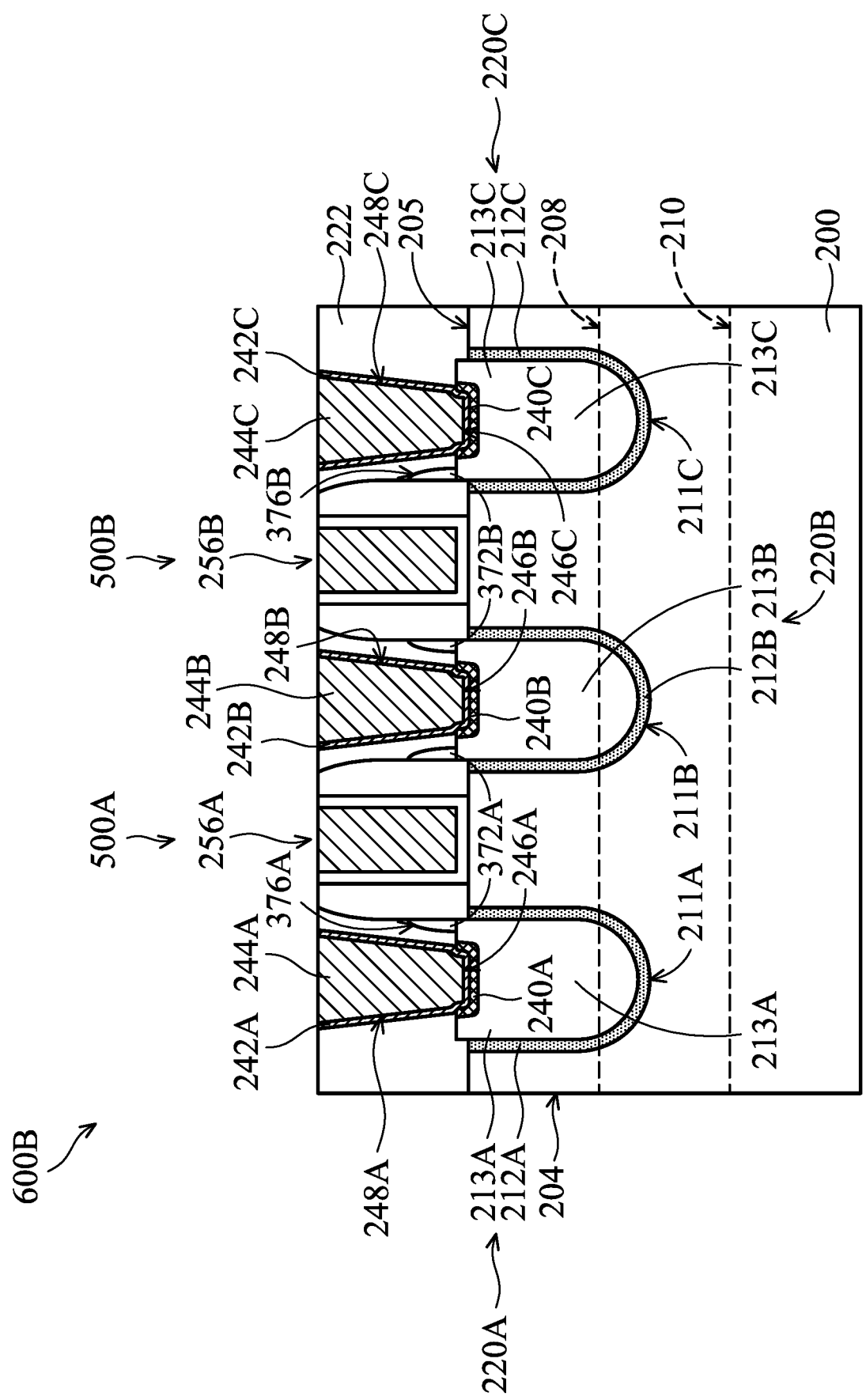
FIG. 14 is a cross-sectional view of a semiconductor structure, in accordance with some embodiments.

FIG. 14 is a cross-sectional view of a semiconductor structure 600B, in accordance with some embodiments. The materials, configurations, structures and/or processes of the semiconductor structure 600B may be similar to, or the same as, those of the semiconductor structure 600A, and the details thereof are not repeated herein. One of the differences between the semiconductor device structure 600A and the semiconductor device structure 600B is that dielectric spacers 372A and 372B are formed by another plasma etching process. The plasma etching process may be performed to remove a portion of dielectric spacers 270A and 270B from top surfaces 274A and 274B of the dielectric spacers 270A and 270B (FIG. 8). In some embodiments, the conditions of the plasma etching process used for forming the semiconductor device structure 600B are different form the conditions of plasma etching process 368. For example, the conditions of the plasma etching process may include temperature, radio-frequency (RF) power, etc.

In some embodiments, the dielectric spacers 372A and 372B of the semiconductor structure 600B are directly over the second source/drain epitaxial layers 213A, 213B and 213C of the source/drain structures 220A, 220B and 220C. The dielectric spacers 372A and 372B may cover portions of the first source/drain epitaxial layer 212A, 212B and 212C of the source/drain structures 220A, 220B and 220C. In addition, the dielectric spacers 372A and 372B may have rounded top portion 376A and 376B due to the conditions of the plasma etching process.

In some embodiments, the dielectric spacers 372A and 372B of the semiconductor structure 600B are positioned on the lower portions of the outer sidewall surfaces of the gate spacers (e.g. the gate spacers 218A and 218B). The dielectric spacers 372A and 372B can help to increase the total volume of the gate spacers. In addition, the dielectric spacers 372A and 372B may help to increase the process window of the contact hole (e.g. the openings 232A, 232B and 232C in the dielectric layer 222 shown in FIG. 11). The distance between the contact plug and the adjacent metal gate structure (e.g. the metal gate structures 256A and 256B) may be further reduced. Therefore, the dielectric spacers 372A and 372B may be used to replace the CESL and help to facilitate the source/drain silicide layer (e.g. the source/drain silicide layers 240A and 240B) formed in a lower position than the top surfaces of the source/drain structure (e.g. the source/drain structures 220A, 220B and 220C). The dielectric spacers 372A and 372B may serve as a block layer to prevent the silicide from extruding from the subsequent source/drain silicide layer to the adjacent metal gate structure. The distance between the contact plug and the adjacent metal gate structure (e.g. the metal gate structures 256A and 256B) may be further reduced. The process yield of the semiconductor structure 600B may be improved.

Figure 15:
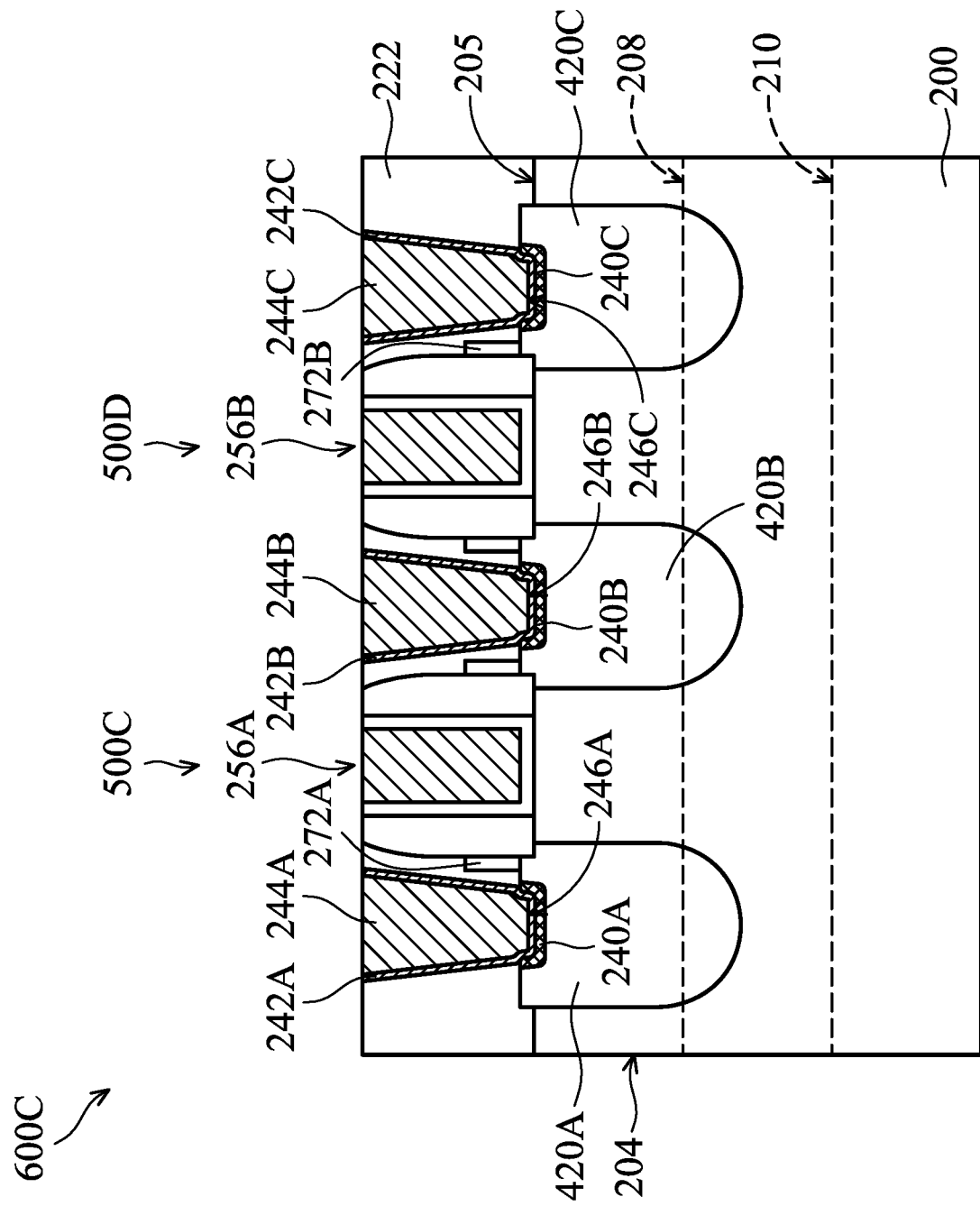
FIG. 15 is a cross-sectional view of a semiconductor structure, in accordance with some embodiments.

FIG. 15 is a cross-sectional view of a semiconductor structure 600C, in accordance with some embodiments. The materials, configurations, structures and/or processes of the semiconductor structure 600C may be similar to, or the same as, those of the semiconductor structure 600A, and the details thereof are not repeated herein. One of the differences between the semiconductor device structure 600A and the semiconductor device structure 600C is that a FinFET 500C and a FinFET 500D of the semiconductor device structure 600C are P-type FinFETs. In addition, the work function layer in the metal gate structures 256A and 256B of the FinFETs 500C and 500D may include P-work-function metal. In some embodiments, source/drain structures 420A, 420B and 420C of the semiconductor device structure 600C are formed of a silicon epitaxial layer with a P-type dopant. For example, the P-type dopant in the source/drain structures 420A, 420B and 420C may include boron (B).

In some embodiments, the dielectric spacer (e.g. the dielectric spacers 272A and 272B) of the semiconductor structure 600C is selectively formed on the lower portion of the outer sidewall surface (e.g. the sidewall surfaces 268A and 268B) of the gate spacer (e.g. the gate spacers 218A and 218B). The dielectric spacer may be used to replace the CESL and may facilitate the source/drain silicide layer (e.g. the source/drain silicide layers 240A and 240B) formed in a lower position than the top surfaces of the source/drain structure (e.g. the source/drain structures 420A, 420B and 420C). Therefore, the dielectric spacer may serve as a block layer to prevent the silicide from extruding from the subsequent source/drain silicide layer to the adjacent metal gate structure (e.g. the metal gate structures 256A and 256B). The process yield of the semiconductor structure 600C may be improved.

As described previously, the N-type FinFET (e.g. the FinFET 500A and the FinFET 500B) of the semiconductor structure (e.g. the semiconductor structure 600A and 600B) includes source/drain structure (e.g. the source/drain structures 220A, 220B and 220C) composed by the first source/drain epitaxial layer (e.g. the first source/drain epitaxial layers 212A, 212B and 212C) with the first N-type dopant and the second source/drain epitaxial layer (e.g. the second source/drain epitaxial layers 213A, 213B and 213C) with the second N-type dopant. The first source/drain epitaxial layer may surround a portion of the second source/drain epitaxial layer in the fin structure 204. In addition, the atomic radius of the first N-type dopant (e.g. As) may be greater than the atomic radius the second N-type dopant (e.g. P). When the semiconductor structure 600A is processed in the thermal processes performed after the formation of the source/drain structure, the first N-type dopant in the first source/drain epitaxial layer may suppress the second N-type dopant in the second source/drain epitaxial layer diffusing into the fin structure 204 (e.g. the channel region of the N-type FinFET). Therefore, the drain induced barrier lowering (DIBL) effect can be reduced. In addition, the electrical conductivity of the first source/drain epitaxial layers (e.g., SiAs) may be better than the electrical conductivity of the second source/drain epitaxial layers (e.g., SiCP). Therefore, on resistance (Ron) of the FinFET may be improved (reduced).

As described previously, the semiconductor structure (e.g. the semiconductor structures 600A, 600B and 600C) includes the dielectric spacer (e.g. the dielectric spacers 272A, 272B, 372A and 372B) selectively formed on a portion of the outer sidewall surface (e.g. the sidewall surfaces 268A and 268B) of the gate spacer (e.g. the gate spacers 218A and 218B). The dielectric spacer may be used to replace the CESL. Therefore, the distance between the contact plug (e.g. the contact plugs 244A, 244B and 244C) and the adjacent metal gate structure (e.g. the metal gate structures 256A and 256B) may be further reduced. In addition, the source/drain silicide layer (e.g. the source/drain silicide layers 240A and 240B) may be formed in a lower position than the top surfaces of the source/drain structure (e.g. the source/drain structures 220A, 220B, 220C, 420A, 420B and 420C). In addition, the dielectric spacer may serve as a block layer to prevent the silicide from extruding from the subsequent source/drain silicide layer to the adjacent metal gate structure. The process yield of the semiconductor structure may be improved.

Embodiments of a semiconductor structure and a method for forming the same are provided. The source/drain structure of the semiconductor structure includes a first source/drain epitaxial layer and a second source/drain epitaxial layer over the first source/drain epitaxial layer. The first source/drain epitaxial layer is in contact with the fin structure. The first source/drain epitaxial layer is connected to a portion of the second source/drain epitaxial layer below a top surface of the fin structure. The atomic radius of the first N-type dopant in the first source/drain epitaxial layer may be greater than the atomic radius the second N-type dopant in the second source/drain epitaxial layer. The first N-type dopant in the first source/drain epitaxial layer may suppress the second N-type dopant in the second source/drain epitaxial layer diffusing into the channel region of the FinFET. The drain induced barrier lowering (DIBL) effect can be reduced.

In some embodiments, a semiconductor structure is provided. The semiconductor structure includes a gate structure formed over a fin structure and a gate spacer formed on a sidewall surface of the gate structure. The semiconductor structure also includes a first source/drain (S/D) epitaxial layer formed in the fin structure and adjacent to the gate spacer, and a second S/D epitaxial layer formed over the first S/D epitaxial layer. A top surface of the second S/D layer is higher than a top surface of the first S/D epitaxial layer.

In some embodiments, a semiconductor structure is provided. The semiconductor structure includes a gate structure formed over a fin structure, and a gate spacer formed over the fin structure and on a sidewall surface of the gate structure. The semiconductor structure includes a dielectric spacer formed on a portion of a sidewall surface of the gate spacer, and a topmost surface of the dielectric spacer is lower than a top surface of the gate spacer.

In some embodiments, a method for forming a semiconductor structure is provided. The method includes forming a gate structure over a fin structure, and forming a source/drain (S/D) structure adjacent to the gate structure. The method also includes forming a blocking layer on a top surface of the S/D structure, and selectively forming a dielectric spacer adjacent to the gate structure. A topmost surface of the dielectric spacer is lower than a top surface of the gate structure.

In some embodiments, a semiconductor structure is provided. The semiconductor structure includes a gate structure formed over a fin structure, and a source/drain (S/D) epitaxial layer formed in the fin structure and adjacent to the gate structure. The S/D epitaxial layer comprises a first S/D epitaxial layer and a second epitaxial layer. The semiconductor structure includes a gate spacer formed on a sidewall surface of the gate structure, and the gate spacer is directly over the first S/D epitaxial layer. The semiconductor structure includes a dielectric spacer formed adjacent to the gate spacer, and the dielectric spacer is directly over the second epitaxial layer.

In some embodiments, a semiconductor structure is provided. The semiconductor structure includes a gate structure formed over a fin structure, and a gate spacer formed on a sidewall surface of the gate structure. The semiconductor structure includes a source/drain (S/D) structure formed in the fin structure and adjacent to the gate spacer, and a dielectric spacer formed on a top surface of the S/D structure. The bottom surface of the dielectric spacer is higher than a bottom surface of the gate spacer.

In some embodiments, a method for forming a semiconductor structure is provided. The method includes forming a gate structure over a fin structure, and forming a source/drain (S/D) structure adjacent to the gate structure. The S/D structure comprises a first S/D epitaxial layer and a second S/D epitaxial layer surrounded by the first S/D epitaxial layer. The method includes forming a blocking layer covering a top surface of the second S/D epitaxial layer, and forming a dielectric spacer on the top surface of the blocking layer and adjacent to the gate structure. The method includes removing the blocking layer, and removing a portion of the dielectric spacer, such that a topmost surface of the dielectric spacer is lower than a top surface of the gate structure.

In some embodiments, a semiconductor structure is provided. The semiconductor structure includes a gate structure formed over a fin structure, and a source/drain (S/D) epitaxial layer formed in the fin structure and adjacent to the gate structure. The semiconductor structure also includes a S/D silicide layer formed on the S/D epitaxial layer, and the S/D silicide layer has a first width, the S/D epitaxial layer has a second width, and the first width is smaller than the second width. The semiconductor structure includes a dielectric spacer between the gate structure and the S/D silicide layer, and a top surface of the dielectric spacer is lower than a top surface of the gate structure.

In some embodiments, a semiconductor structure is provided. The semiconductor structure includes a gate structure formed over a fin structure, and the gate structure includes a gate dielectric layer and a gate electrode layer. The semiconductor structure includes a source/drain (S/D) epitaxial layer formed in the fin structure and adjacent to the gate structure. The semiconductor structure includes a dielectric spacer between the gate structure and the S/D epitaxial layer, and a bottom surface of the dielectric spacer is higher than a bottommost surface of the gate dielectric layer.

In some embodiments, a method for forming a semiconductor structure is provided. The method includes forming a gate structure over a fin structure, and forming a source/drain (S/D) structure adjacent to the gate structure. The method includes forming a blocking layer covering a top surface of the S/D structure, and forming a dielectric spacer on the top surface of the S/D structure and adjacent to the gate structure, and a topmost surface of the dielectric spacer is lower than a top surface of the gate structure. The method further includes f removing a portion of the S/D structure to form an opening, and the opening is lower than a top surface of the S/D structure. The method includes forming a contact plug in the opening.

In some embodiments, a semiconductor structure is provided. The semiconductor structure includes a gate structure formed over a fin structure, and a gate spacer layer formed on a sidewall surface of the gate structure. The semiconductor structure includes a source/drain (S/D) epitaxial layer formed adjacent to the gate structure, and a dielectric spacer layer formed on the S/D epitaxial layer. The semiconductor structure includes a contact plug barrier formed over the S/D epitaxial layer, and a contact plug surrounding by the contact plug barrier, wherein the contact plug is separated from the gate spacer layer by the dielectric spacer layer and the contact plug barrier.

In some embodiments, a semiconductor structure is provided. The semiconductor structure includes a gate structure formed over a fin structure, and a source/drain (S/D) epitaxial layer formed adjacent to the gate structure. The S/D epitaxial layer includes a first U-shaped S/D epitaxial layer and a second S/D epitaxial layer surrounded by the first U-shaped S/D epitaxial layer. The semiconductor structure includes a dielectric spacer layer formed on the second S/D epitaxial layer, wherein the dielectric spacer layer is separated from the first U-shaped S/D epitaxial layer by the second S/D epitaxial layer. In some embodiments, a method for forming a semiconductor structure is provided. The method includes forming a gate structure over a fin structure, and forming a source/drain (S/D) structure adjacent to the gate structure. The method includes forming a blocking layer covering a top surface of the S/D structure, and the blocking layer includes native oxide layer and methyl group. The method includes forming a dielectric spacer on the top surface of the S/D structure and adjacent to the gate structure. The method includes after forming the dielectric spacer, removing the blocking layer from the top surface of the S/D structure. The method includes forming a contact plug on the S/D structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a gate structure formed over a fin structure;
   a gate spacer layer formed on a sidewall surface of the gate structure;
   a source/drain (S/D) epitaxial layer formed adjacent to the gate structure in a recess of the fin structure, wherein the S/D epitaxial layer comprises a first S/D epitaxial layer and a second S/D epitaxial layer, and there is a step height between a top surface of the second epitaxial layer and a top surface of the first epitaxial layer, wherein a thickness of the second S/D epitaxial layer is greater than a thickness of the first S/D epitaxial layer, and wherein the gate spacer layer is formed over a top surface of the S/D epitaxial layer;
   a dielectric spacer layer formed on the S/D epitaxial layer;
   a contact plug barrier formed over the S/D epitaxial layer; and
   a contact plug surrounded by the contact plug barrier, wherein the contact plug is separated from the gate spacer layer by the dielectric spacer layer and the contact plug barrier.

2. The semiconductor structure as claimed in claim 1, wherein the contact plug barrier comprises titanium nitride (TiN).

3. The semiconductor structure as claimed in claim 1, wherein the contact plug is separated from the S/D epitaxial layer by the contact plug barrier.

4. The semiconductor structure as claimed in claim 1, further comprising:
   a S/D silicide layer formed on the S/D epitaxial layer, wherein the S/D silicide layer is separated from the gate spacer layer by the dielectric spacer layer.

5. The semiconductor structure as claimed in claim 4, wherein an entirety of the S/D silicide layer is lower than a bottom surface of the dielectric spacer layer.

6. The semiconductor structure as claimed in claim 1, wherein an interface between the first S/D epitaxial layer and the second S/D epitaxial layer is aligned with an interface between the gate spacer layer and the dielectric spacer layer.

7. The semiconductor structure as claimed in claim 1, further comprising: a dielectric layer surrounding the contact plug, wherein the dielectric layer is in direct contact with a top surface of the S/D epitaxial layer.

8. A semiconductor structure, comprising:
   a gate structure formed over a fin structure;
   a gate spacer layer formed on a sidewall surface of the gate structure;
   a source/drain (S/D) epitaxial layer formed adjacent to the gate structure, wherein the S/D epitaxial layer comprises a first U-shaped S/D epitaxial layer and a second S/D epitaxial layer surrounded by the first U-shaped S/D epitaxial layer, and wherein the second S/D epitaxial layer protrudes from a top surface of the first U-shaped S/D epitaxial layer; and
   a dielectric spacer layer formed on a sidewall surface of the gate spacer layer, wherein the dielectric spacer layer directly contacts the second S/D epitaxial layer, and wherein the dielectric spacer layer is separated from the first U-shaped S/D epitaxial layer by the second S/D epitaxial layer.

9. The semiconductor structure as claimed in claim 8, wherein an outer sidewall surface of the first U-shaped S/D epitaxial layer extends beyond an outer sidewall surface of the second S/D epitaxial layer.

10. The semiconductor structure as claimed in claim 8, further comprising: a dielectric layer between the dielectric spacer layer and the second S/D epitaxial layer, wherein the dielectric layer is in direct contact with the second S/D epitaxial layer.

11. The semiconductor structure as claimed in claim 8, wherein there is a step height between a top surface of the first U-shaped S/D epitaxial layer and a bottom surface of the dielectric spacer layer.

12. The semiconductor structure as claimed in claim 8, further comprising:

a S/D silicide layer formed on the S/D epitaxial layer, wherein the S/D silicide layer is separated from the gate structure by the dielectric spacer layer.

13. A method for forming a semiconductor structure, comprising:

forming a gate structure over a fin structure;

forming a source/drain (S/D) structure adjacent to the gate structure;

forming a blocking layer covering a top surface of the S/D structure, wherein the blocking layer includes a native oxide layer and methyl group and wherein a portion of the S/D structure is transformed into the blocking layer;

forming a dielectric spacer on the top surface of the S/D structure and adjacent to the gate structure;

after forming the dielectric spacer, removing the blocking layer from the top surface of the S/D structure; and forming a contact plug on the S/D structure.

14. The method for forming the semiconductor structure as claimed in claim 13, wherein the S/D structure comprises a first S/D epitaxial layer and a second epitaxial layer, and a sidewall surface of the dielectric spacer aligned with a sidewall surface of the first S/D epitaxial layer.

15. The method for forming the semiconductor structure as claimed in claim 13, further comprising:

removing a top portion of the dielectric spacer to reduce a height of the dielectric spacer.

16. The method for forming the semiconductor structure as claimed in claim 13, further comprising:

forming a S/D silicide layer before forming the contact plug, wherein the S/D silicide layer is separated from the gate structure by the dielectric spacer.

* * * * *